US012597456B2

(12) United States Patent
Jariwala et al.

(10) Patent No.: US 12,597,456 B2
(45) Date of Patent: Apr. 7, 2026

(54) FIELD-PROGRAMMABLE FERRO-DIODES FOR RECONFIGURABLE IN-MEMORY-COMPUTING

(71) Applicant: THE TRUSTEES OF THE UNIVERSITY OF PENNSYLVANIA, Philadelphia, PA (US)

(72) Inventors: Deep Jariwala, Philadelphia, PA (US); Roy H. Olsson, III, Phoenixville, PA (US); Eric Andrew Stach, Swarthmore, PA (US); Xiwen Liu, Philadelphia, PA (US); Dixiong Wang, Milpitas, CA (US); Jeffrey Zheng, Philadelphia, PA (US); Merrilyn Mercy Adzo Fiagbenu, Philadelphia, PA (US)

(73) Assignee: The Trustees of the University of Pennsylvania, Philadelphia, PA (US)

( * ) Notice: Subject to any disclaimer, the term of this patent is extended or adjusted under 35 U.S.C. 154(b) by 148 days.

(21) Appl. No.: 18/553,253

(22) PCT Filed: Mar. 30, 2022

(86) PCT No.: PCT/US2022/071440
§ 371 (c)(1),
(2) Date: Sep. 29, 2023

(87) PCT Pub. No.: WO2022/213087
PCT Pub. Date: Oct. 6, 2022

(65) Prior Publication Data
US 2024/0177759 A1    May 30, 2024

Related U.S. Application Data

(60) Provisional application No. 63/167,765, filed on Mar. 30, 2021.

(51) Int. Cl.
| | |
|---|---|
| *G11C 11/22* | (2006.01) |
| *H10B 69/00* | (2023.01) |
| *H10D 8/00* | (2025.01) |

(52) U.S. Cl.
CPC .......... *G11C 11/2275* (2013.01); *H10B 69/00* (2023.02); *H10D 8/00* (2025.01)

(58) Field of Classification Search
CPC ... G11C 11/2275; G11C 11/54; G11C 15/046; H10B 69/00; H10B 63/80; H10D 8/00; (Continued)

(56) References Cited

U.S. PATENT DOCUMENTS

| | | | | |
|---|---|---|---|---|
| 10,249,360 B1 * | 4/2019 | Chang | ................ | G11C 13/0038 |
| 2012/0011090 A1 | 1/2012 | Tang et al. | | |

(Continued)

FOREIGN PATENT DOCUMENTS

| | | |
|---|---|---|
| CN | 103346256 A | 10/2013 |

OTHER PUBLICATIONS

Fitchner, S et al., AlScN: A III-V semiconductor based ferroelectric, J. Appl. Phys. 125, 114103 (2019) (Year: 2019).*

(Continued)

*Primary Examiner* — Jerome Leboeuf
(74) *Attorney, Agent, or Firm* — BakerHostetler

(57) ABSTRACT

Ferroelectric diodes comprising materials such as aluminum scandium nitride (AlScN) or hafnium zirconium oxide (HfZrO₂) may be formed atop semiconductor structures such as CMOS wafers to create storage memory cells, search Ternary Content Addressable Memory (TCAM) cells, and/ neural circuitry. The diodes are non-volatile and field programmable via pulsing to a pulse-number-dependent analog state, with high on/off and self-rectifying ratios. Cells may be formed, for example, with two diodes that are oppositely (Continued)

polarized, and may be achieved without transistors to form, for example, 0T-2R structures.

20 Claims, 29 Drawing Sheets

(58) Field of Classification Search
CPC ................. H10D 48/381; H10D 62/80; H01L
21/02579; H01L 21/02178; H01L
21/02192; H01L 21/02194; H01L
21/02266; H01L 21/02425; H01L
21/0254; H01L 21/02581; H01L
21/02631; H10N 70/026; H10N 70/20;
H10N 70/826
See application file for complete search history.

(56) References Cited

U.S. PATENT DOCUMENTS

| | | | |
|---|---|---|---|
| 2013/0106462 | A1 | 5/2013 | Yang et al. |
| 2016/0111639 | A1 | 4/2016 | Wells et al. |
| 2016/0225775 | A1 | 8/2016 | Park et al. |
| 2019/0332708 | A1* | 10/2019 | Strachan .............. G06F 16/2468 |
| 2020/0006383 | A1* | 1/2020 | Petti ........................ H10B 51/10 |
| 2020/0357821 | A1 | 11/2020 | Chen |
| 2020/0394506 | A1 | 12/2020 | Louizos et al. |
| 2021/0026601 | A1 | 1/2021 | Kobayashi et al. |
| 2021/0050060 | A1* | 2/2021 | Li ......................... G11C 7/1006 |
| 2021/0066318 | A1* | 3/2021 | Chang ................. G11C 11/5657 |
| 2021/0151445 | A1* | 5/2021 | Wagner ................ H10D 64/689 |
| 2021/0408049 | A1* | 12/2021 | Young .................... H10B 53/40 |
| 2022/0137941 | A1* | 5/2022 | Wu ......................... G06N 3/065 |
| | | | 717/146 |

OTHER PUBLICATIONS

Berndan et al., "Low-Power Linear Computation Using Nonlinear Ferroelectric Tunnel Junction Memristors", Nature Eletron, 2020, vol. 3, pp. 259-266.

Ielmini et al., "In-memory Computing With Resistive Switching Devices", Nature Electron, 2018, vol. 1, pp. 333-343.

Kumar et al. "Air-Stable Memory Array of Bistable Rectifying Diodes Based on Ferroelectric—Semiconductor Polymer Blends" Appl. Phys. Lett. 2018, vol. 112, pp. 123302-1-123302-4.

Lecun et al., "Gradient-Based Learning Applied to Document Recognition", Proceedings of the IEEE, 1998, vol. 86, Issue 11, pp. 2278-2324.

Li et al., "Three-Dimensional Crossbar Arrays of Self-Rectifying Si/Sio2/Si Memristors" Nature Communications, 2017, vol. 8, No. 15666, pp. 1-9.

Li et al., "1 Mb 0.41 μm² 2T-2R Cell Nonvolatile TCAM With Two-Bit Encoding and Clocked Self-Referenced Sensing", IEEE Journal of Solid-State Circuits, 2014, vol. 49, Issue 4, pp. 896-907.

Lin et al., "7.4 A 256b-Wordlength ReRAM-based TCAM With 1ns Search-Time and 14× Improvement in Wordlength-Energyefficiency-Density Product Using 2.5T1R Cell", 2016 IEEE International Solid-State Circuits Conference (ISSCC), 2016, pp. 136-138.

Olsson et al., "Doping of Aluminum Nitride and the Impact on Thin Film Piezoelectric and Ferroelectric Device Performance", 2020 IEEE Custom Integrated Circuits Conference (CICC), 2020, pp. 1-6.

Ota et al., "Performance Maximization of In-Memory Reinforcement Learning with Variability-Controlled Hf1-xZrxO2 Ferroelectric Tunnel Junctions", IEDM Tech. Dig., 2019, pp. 6.2.1-6.2.4.

Pagiamtzis et al., "Content-Addressable Memory (CAM) Circuits and Architectures: A Tutorial And Survey", IEEE Journal of Solid-State Circuits, 2006, vol. 41, No. 3, pp. 712-727.

Qiangfei et al., "Memristive Crossbar Arrays for Brain-Inspired Computing", Nature Materials, 2019, vol. 18, pp. 309-323.

Serb et al., "Practical Determination of Individual Element Resistive States in Selectorless RRAM Arrays", IEEE Transactions on Circuits and Systems I, 2016, vol. 63, pp. 827-835.

Sharma et al., "A Room-Temperature Ferroelectric Semimetal", Science Advances, 2019, vol. 5, Issue 7, pp. 1-8.

Tan et al. "Experimental Demonstration of a Ferroelectric HfO2-based Content Addressable Memory Cell" IEEE Electron Device Letters, 2020, vol. 41, Issue 2, pp. 1-4.

Wang et al., "Ferroelectric Switching in Sub-20 nm Aluminum Scandium Nitride Thin Films", IEEE Electron Device Letters, 2020, vol. 41, No. 12, pp. 1774-1777.

Anonymous Diode: "Diode"—Wikipedia, Retrieved from https://en.wikipedia.org/w/index.php?title=Diode&oldid=832263040, Retrieved on Mar. 6, 2025, pp. 1-19.

Asadi K., "Resistance switching in two-terminal ferroelectric •semiconductor lateral heterostructures", Phys. Rev., vol. 7, 021307, Jun. 2, 2020, 22 Pages.

Liu et al., "A CMOS Compatible Aluminum Scandium Nitride-based Ferroelectric Tunnel Junction Memristor", 2020, pp. 1-12.

Liu et al., "Post-CMOS Compatible Aluminum Scandium Nitride/2D Channel Ferroelectric Field-Effect-Transistor", 2020, 28 Pages.

* cited by examiner

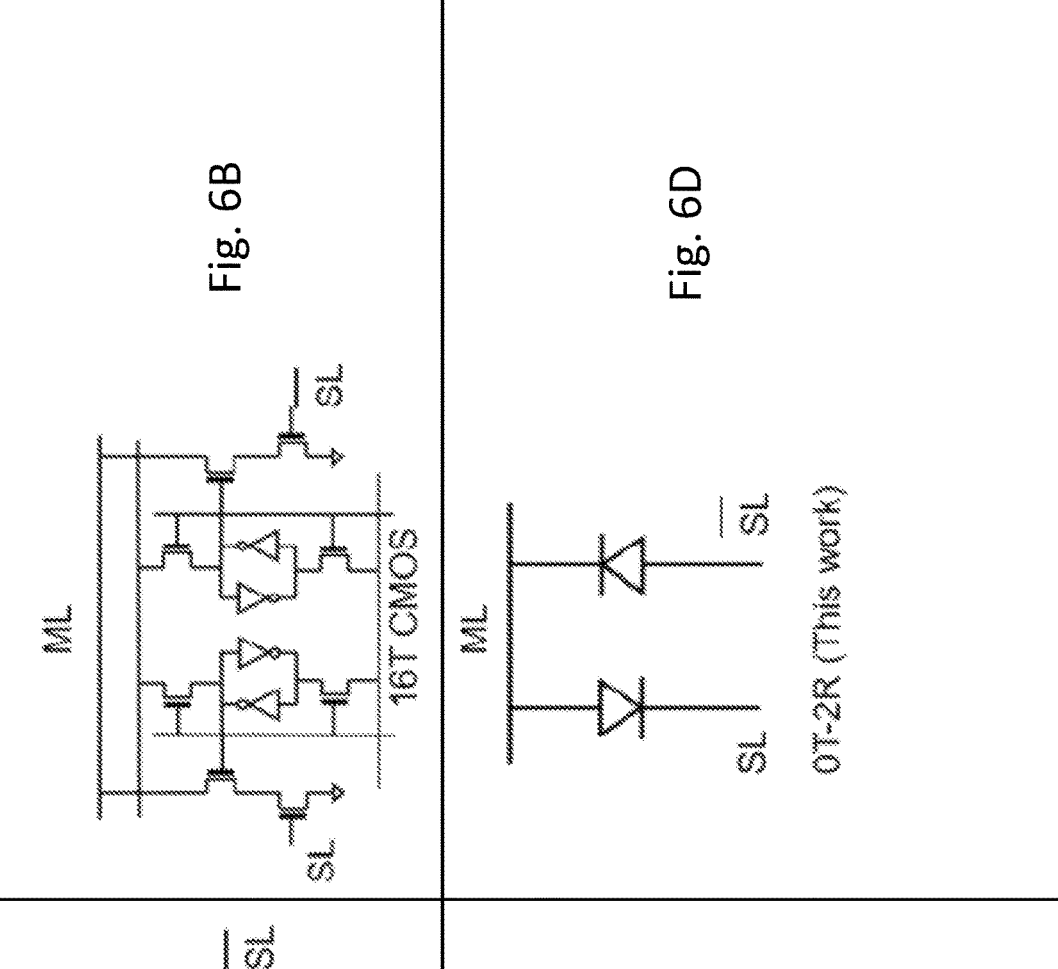
Fig. 6B
Fig. 6D
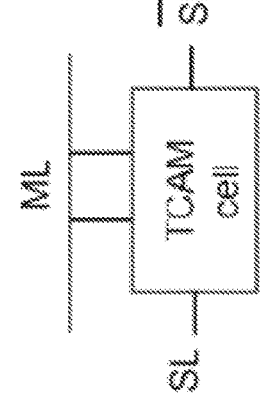
Fig. 6A
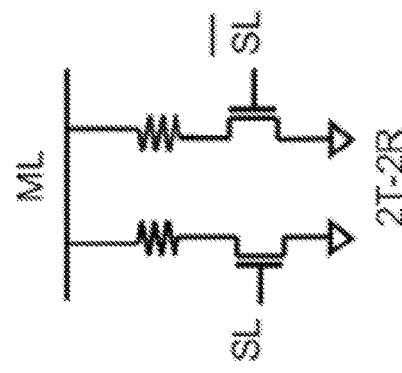
Fig. 6C
FIG. 6

| Pt | Sr | Store | St | St | Search | Results |
| --- | --- | --- | --- | --- | --- | --- |
| negative-forward | negative-forward | Don't care | Vr | 0 | 1 | Match |
| negative-forward | negative-forward | Don't care | 0 | Vr | 0 | Match |
| positive-forward | negative-forward | 1 | Vr | 0 | 1 | Match |
| positive-forward | negative-forward | 1 | 0 | Vr | 0 | Mis |
| negative-forward | positive-forward | 0 | Vr | 0 | 1 | Mis |
| negative-forward | positive-forward | 0 | 0 | Vr | 0 | Match |

FIG. 7 exp($\alpha V$)

(a)                 (b)

FIELD-PROGRAMMABLE FERRO-DIODES FOR RECONFIGURABLE IN-MEMORY-COMPUTING

RELATED APPLICATIONS

The present application is the National Stage Application of International Patent Application No. PCT/US2022/071440 (filed Mar. 30, 2022); which claims the benefit of U.S. Provisional Patent Application No. 63/167,765 filed on Mar. 30, 2021. All foregoing applications are incorporated herein in their entireties for any and all purposes.

GOVERNMENT RIGHTS

This invention was made with government support under HR0011-20-9-0046 awarded by the Department of Defense. The government has certain rights in the invention.

BACKGROUND

This application pertains to applications for ferro-diodes in memory devices and search and computation systems.

SUMMARY

By leveraging the unique characteristics of a field-programmable ferroelectric diode (ferro-diode), constructed from an emerging ferroelectric material Aluminum Scandium Nitride (AlScN), we demonstrate a reconfigurable architecture involving zero transistors (OT) that enables multiple data-intensive applications, e.g., storage, search, and neural networks. Specifically, we demonstrate ferro-diodes which are non-volatile and have a high on/off ratio over 104 and a high self-rectifying ratio over 104, and which are compatible with CMOS Back End of Line (BEOL) processing. Based on those unique properties, new non-volatile Ternary Content Addressable Memories (TCAMs) using 0-transistor/2-resistor-storage (0T-2R) cells are described. Due to the non-existence of transistors, the 0T-2R TCAMs have the most compact design known, along with a search delay below 100 ps, based on SPICE simulations.

In addition to scandium, other dopants may be used in the formation of aluminum nitride ferrodiodes. Such ferrodiodes may be used in a variety of circuits and systems.

We also experimentally demonstrate a 4-bit ferro-diode synapse with high linearity and symmetric potentiation/depression characteristics, which enables its application in high-accuracy and low-latency neural network inference. Our architecture design is benchmarked by experimental ferro-diode data and LeNet-5 architecture in the PyTorch framework. This shows an inference accuracy ~97.5% on the MNIST dataset, approaching ideal software-level inference.

In one aspect, the present disclosure provides a memory cell, comprising an array of ferroelectric diodes, the ferroelectric diodes optionally comprising aluminum scandium nitride (AlScN) or hafnium zirconium oxide ($HfZrO_2$), the ferroelectric diodes being characterized as non-volatile and field programmable via pulsing to a pulse-number-dependent analog state.

Also provided is an array of memory cells, comprising plural instances of the memory cell of the present disclosure (e.g., according to any of Aspects 1-8), the array being arranged for a V/2 scheme that is used to readout and to program the ferroelectric diodes.

Further provided is a Ternary Content Addressable Memory (TCAM), comprising: a memory cell according to the present disclosure (e.g., according to any one of Aspects 1-8).

Additionally disclosed is a neural network, comprising an array of multi-bit diode synapses, wherein each diode synapse optionally comprises a ferroelectric diode comprising aluminum scandium nitride (AlScN), for example, and wherein each diode is non-volatile and field programmable via pulsing to a pulse-number-dependent analog state.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to limitations that solve any or all disadvantages noted in any part of this disclosure.

BRIEF DESCRIPTION OF THE DRAWINGS

A more detailed understanding may be had from the following description, given by way of example in conjunction with the accompanying drawings. The drawings are not necessarily to scale.

FIGS. 6A-6D are electrical schematics of single cell TCAM implementations.

FIG. 6A shows the connections a general TCAM.

FIG. 6B shows a 16T CMOS TCAM.

FIG. 6C show a 2T-2R TCAM.

FIG. 6D shows a 0T-2R TCAM.

FIG. 7 is a chart of voltage modes and encoding for various values of stored states, search voltages, and search results.

3

Figure 12:
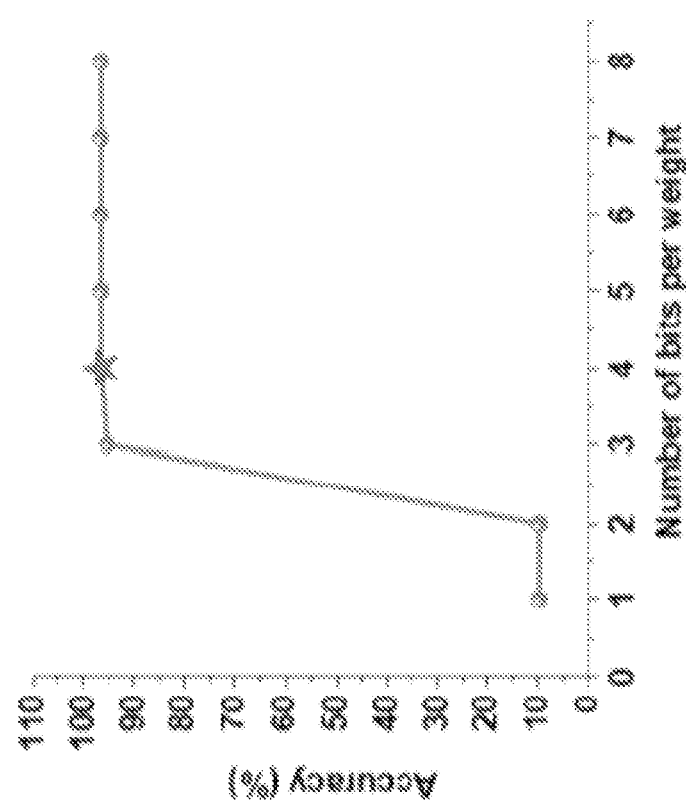
Figure 11:
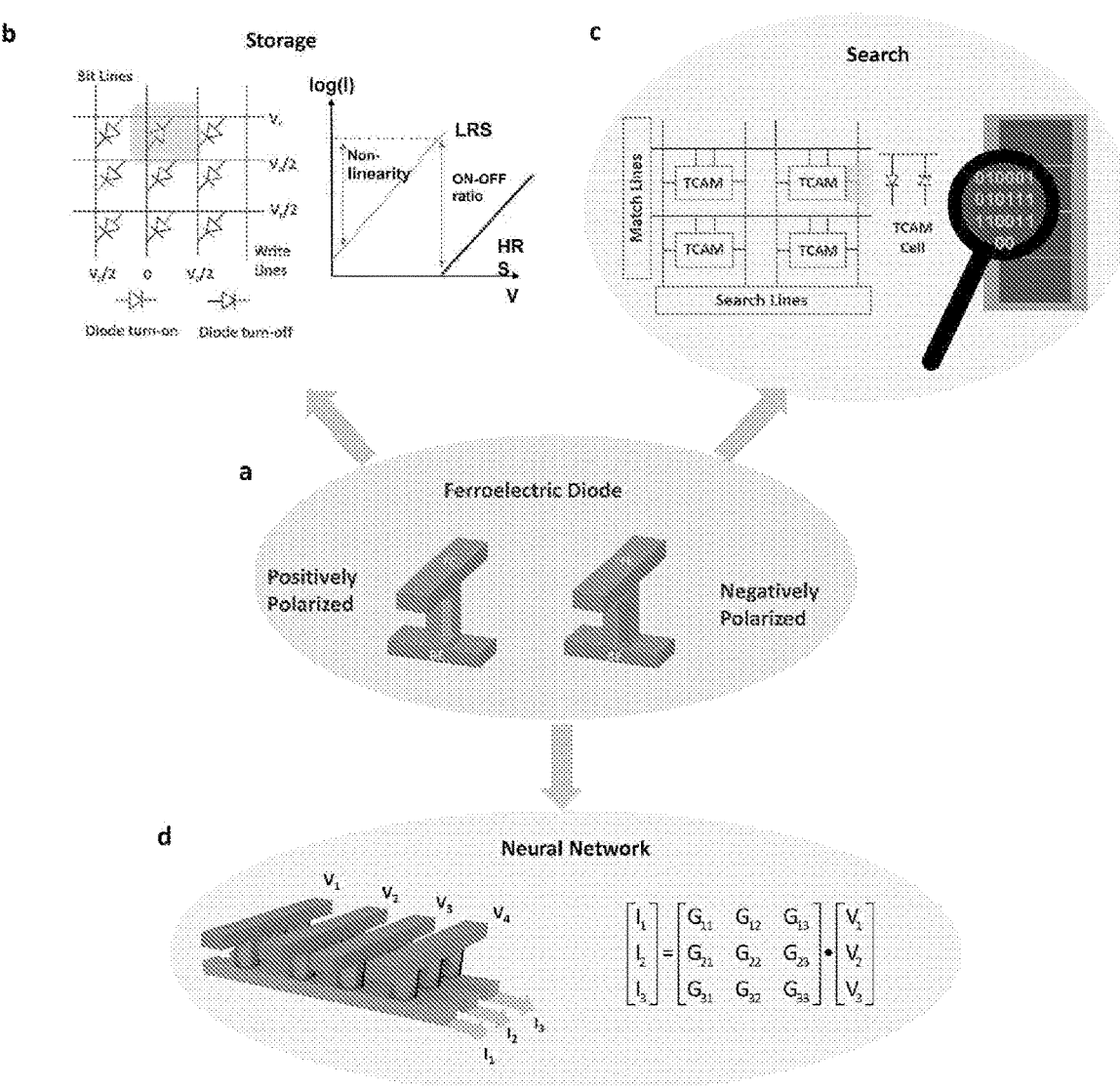
Figure 12:
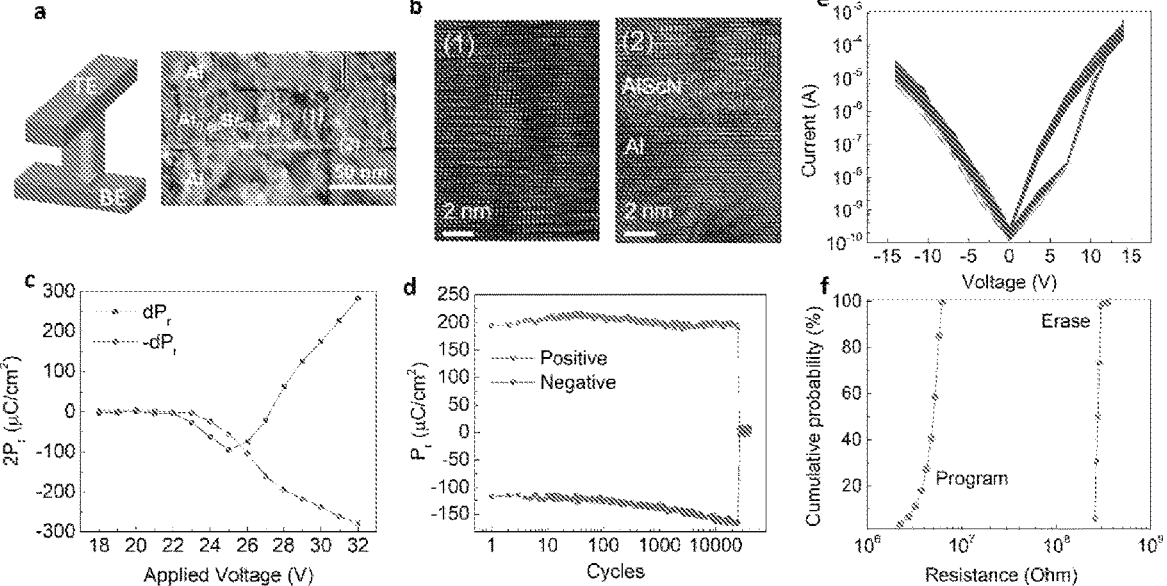

FIG. 12 is a graphed of benchmarked inference accuracy of LeNet-5 versus the number of bits per weight. This shows an inference accuracy of about 97.5% on MNIST dataset on present devices, approaching the ideal software-level inference.

Figure 11:
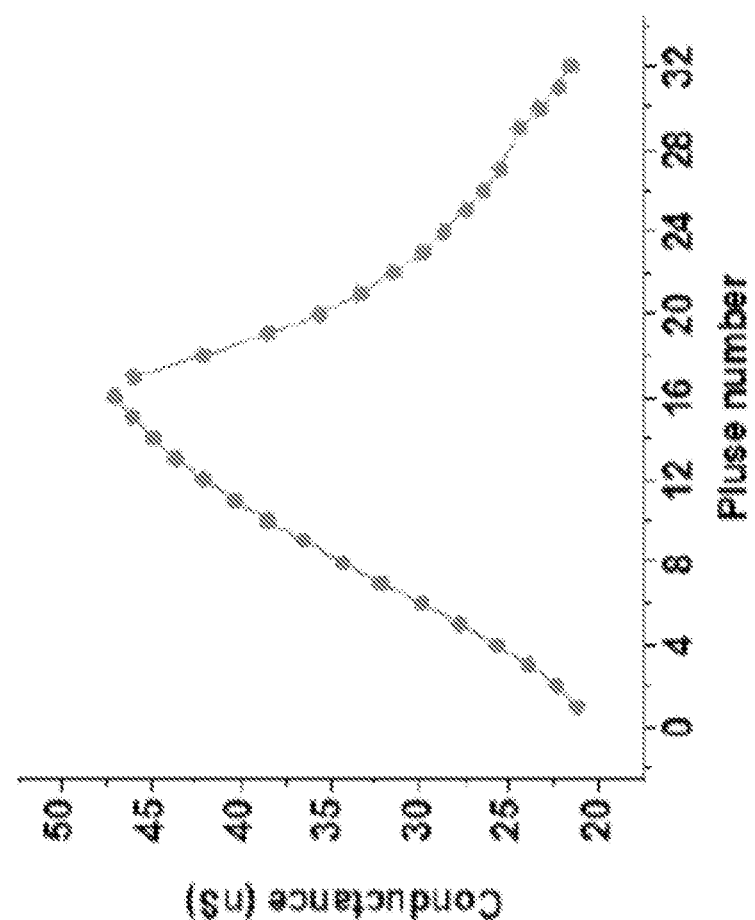
FIG. 11 is a graph of conductance versus the number of positive and negative pulse trains applied in sequence. The ferro-diode is capable of bipolar, pulse-number-dependent analogue state modulation.

FIG. 11 illustrates reconfigurable CIM on field-programmable ferroelectric diodes FIG. 12 illustrates room-temperature electrical characterization of AlScN/MoS2 FE-FETs.

Figure 13:
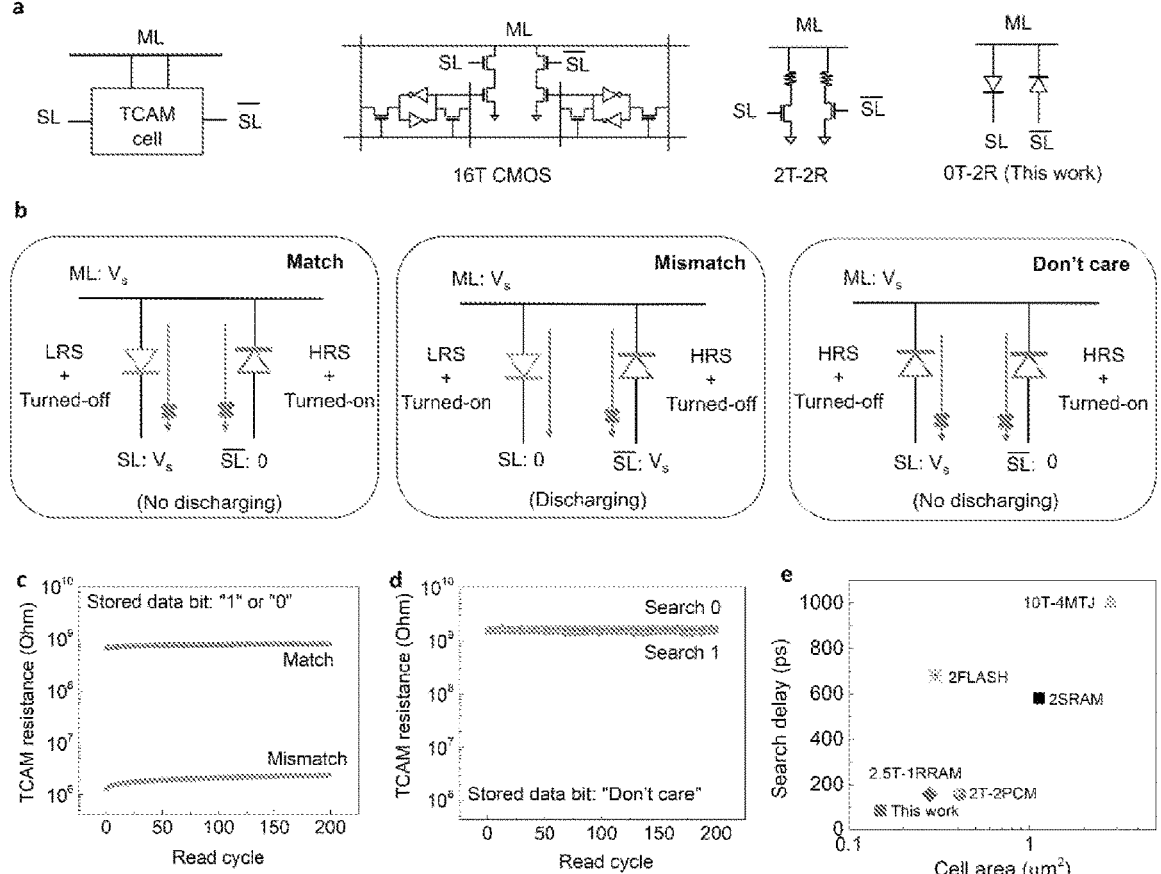

FIG. 13 illustrates a 2-FeD TCAM cell for search operation

Figure 14:
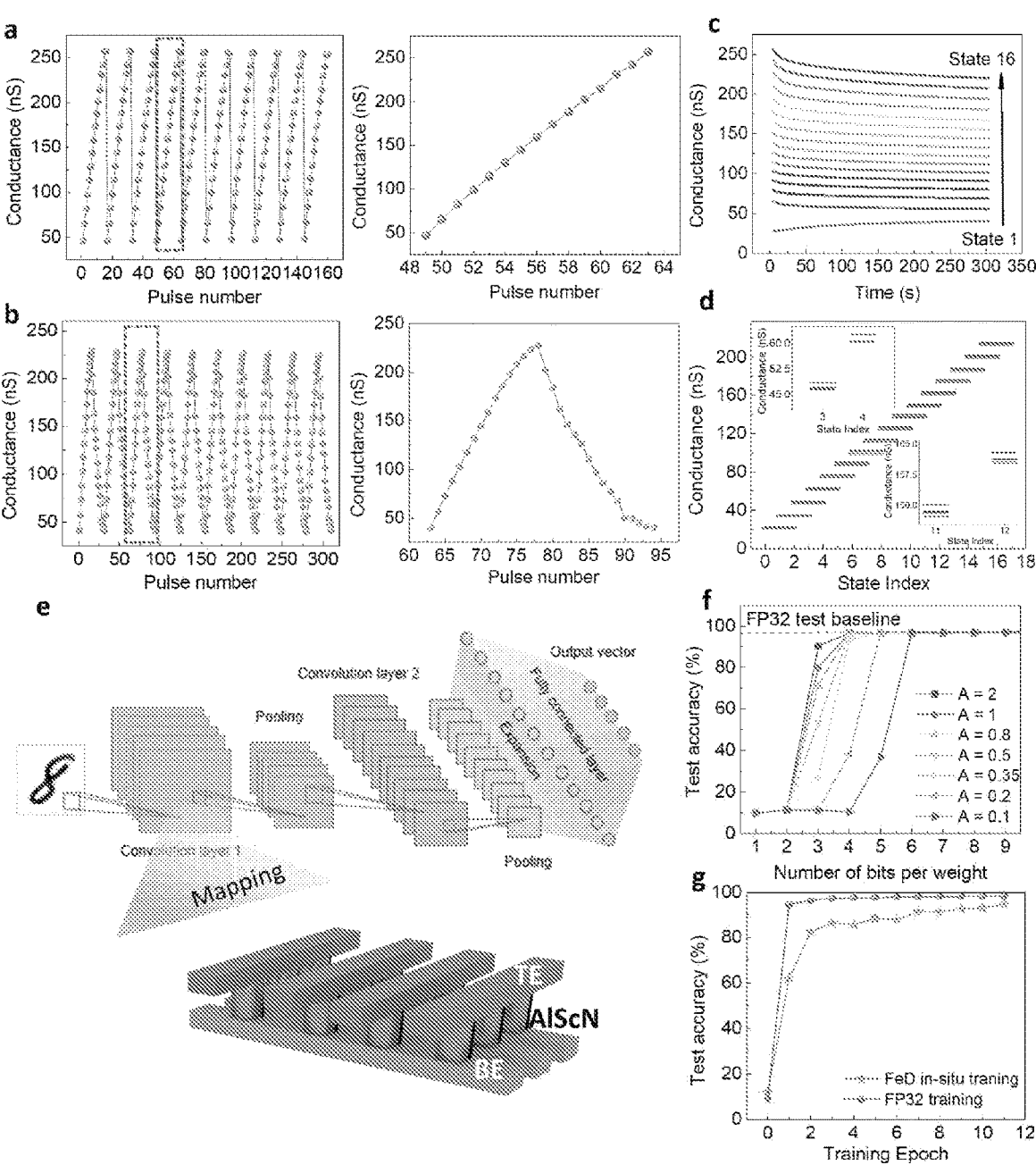

FIG. 14 illustrates a FeD-based neural network.

Figure 15:
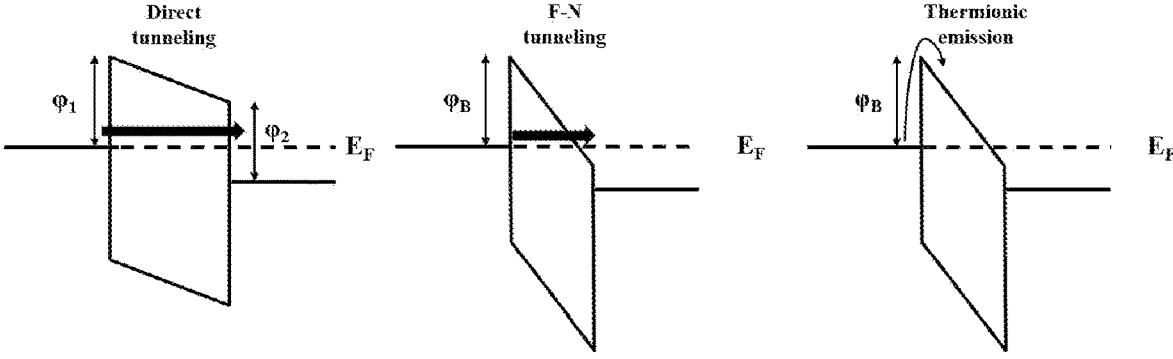

FIG. 15 illustrates three methods of electron transport through a potential barrier.

Figure 16:
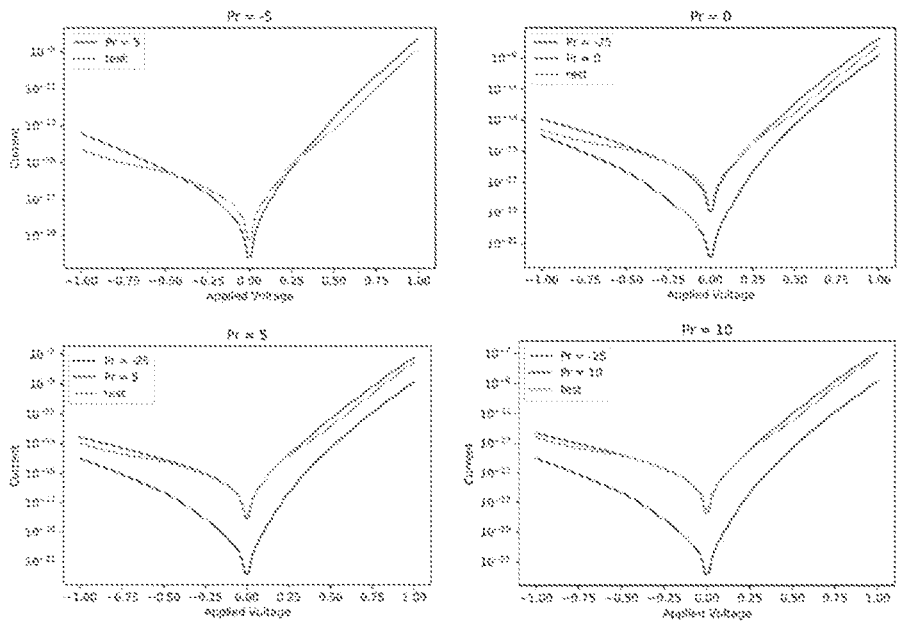

FIG. 16 illustrates comparisons of the IV curves using the WKB approximation vs. the new voltage shifting model for a ferroelectric diode for any arbitrary ferroelectric.

Figure 17:
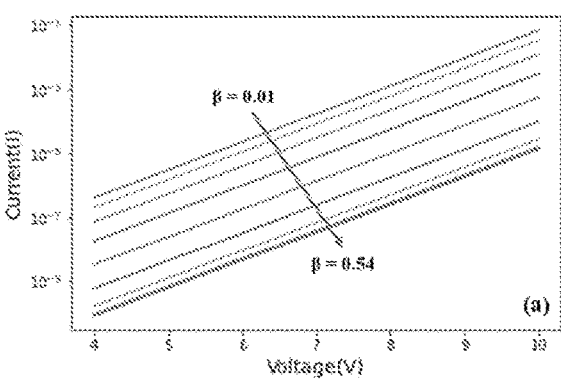
Figure 17:
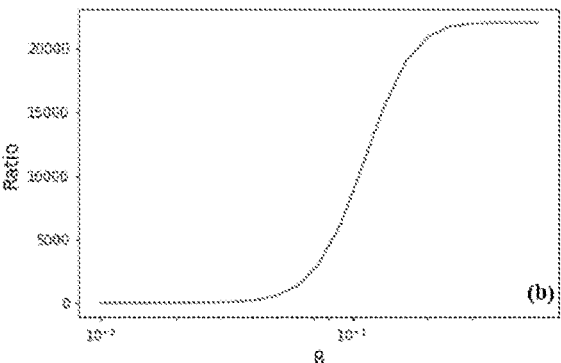

FIG. 17 illustrates HRS I-V curve shifting with the variation of the pre-coded oxide capacitance image.

Figure 18:
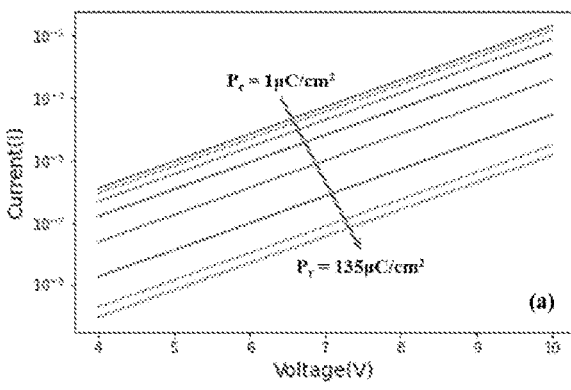
Figure 18:
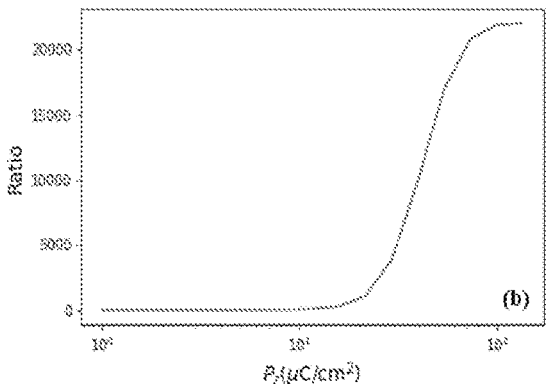

FIG. 18 illustrates HRS I-V curve shifting with the variation of the remanent polarization image.

Figure 19:
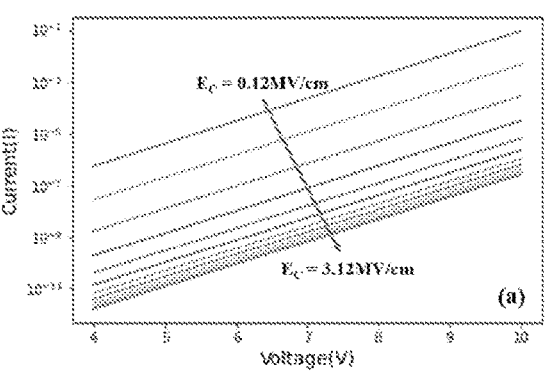
Figure 19:
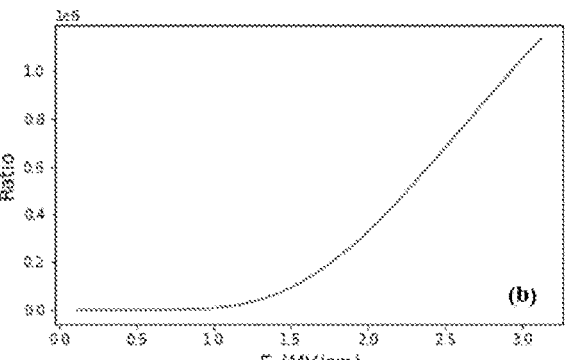

FIG. 19 illustrates I-V curve shifting with the variation of the result of the coercive field image.

Figure 20:
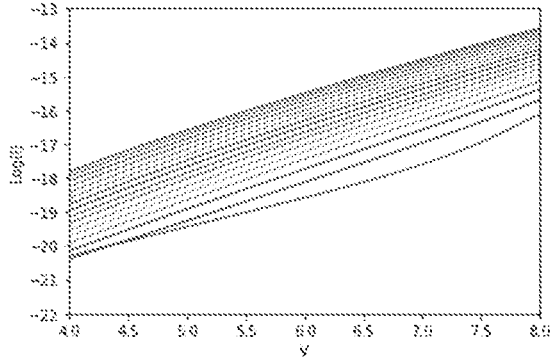

FIG. 20 illustrates Log(I) vs V. Current I measured by applying dc voltage sweeping to 16 different states.

Figure 21:
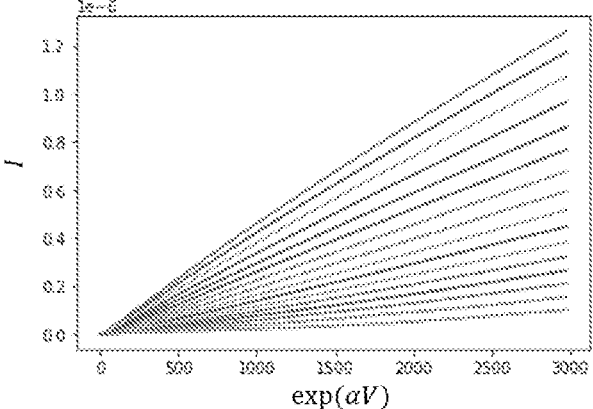

FIG. 21 illustrates current vs. image for 16 different states.

Figure 22:
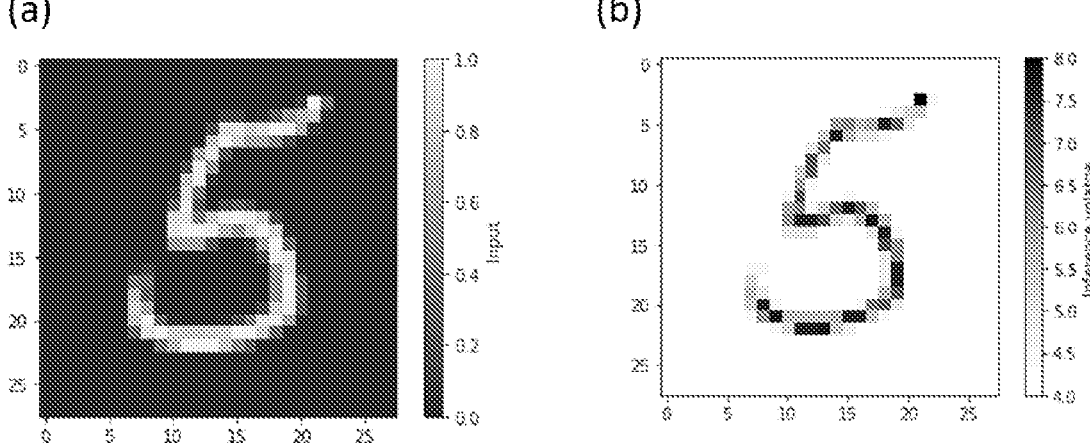

FIG. 22 illustrates a picture of a number '5' as input from MNIST dataset and plotting after mapping.

Figure 23:
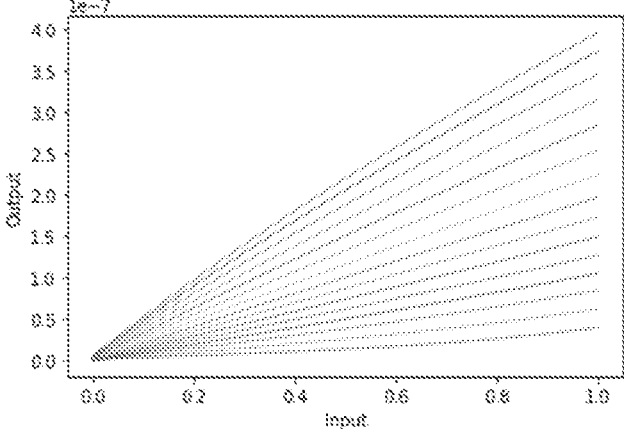

FIG. 23 illustrates measured current at the output with applying the encoded voltages on the ferroelectric diode devices which are responding to an original input.

Figure 24:
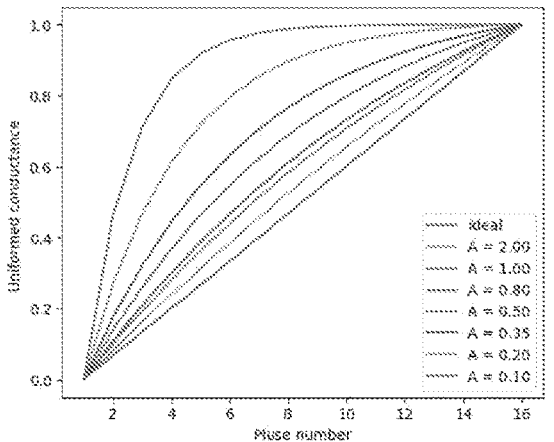
Figure 24:
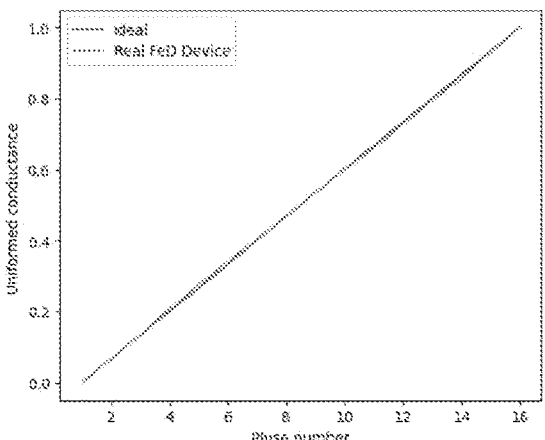

FIG. 24 illustrates normalized conductances.

Figure 25:
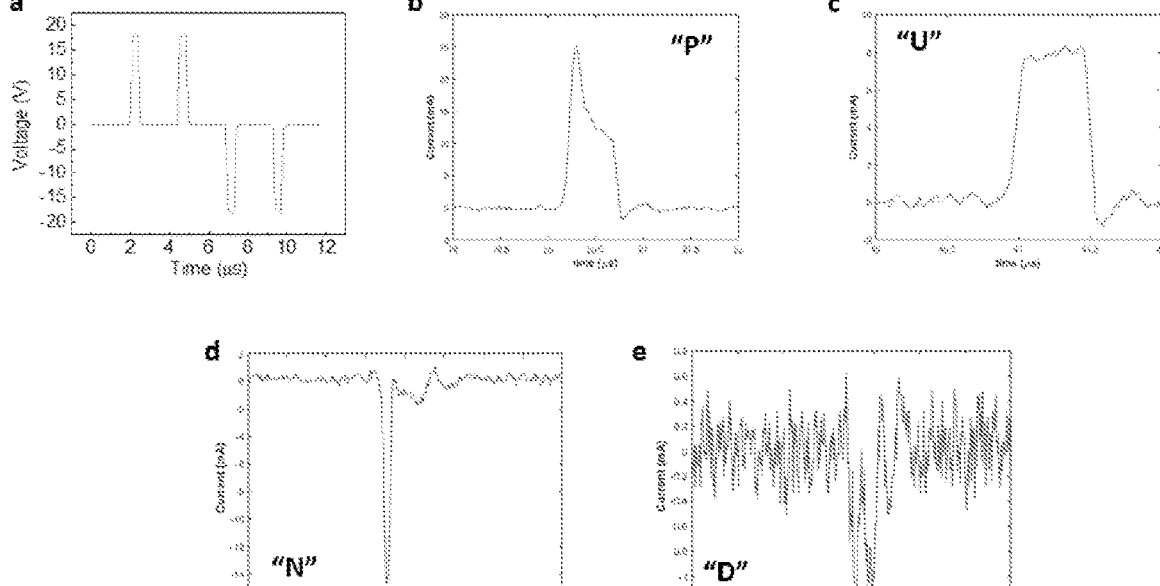

FIG. 25 illustrates e signal sequences for the PUND measurements.

Figure 26:
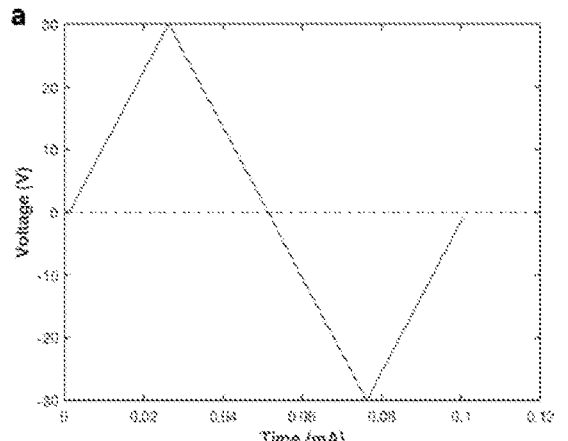
Figure 26:
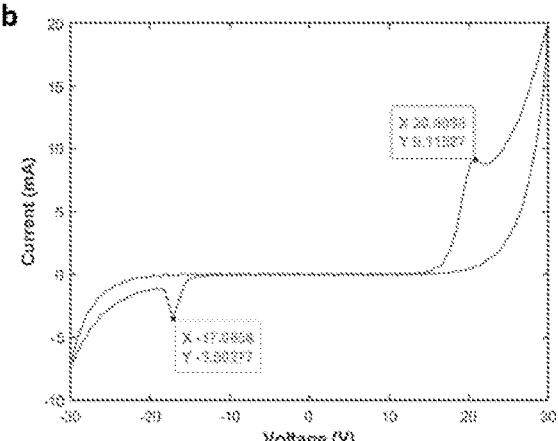

FIG. 26 illustrates a dynamic current response in 45 nm AlScN.

Figure 27:
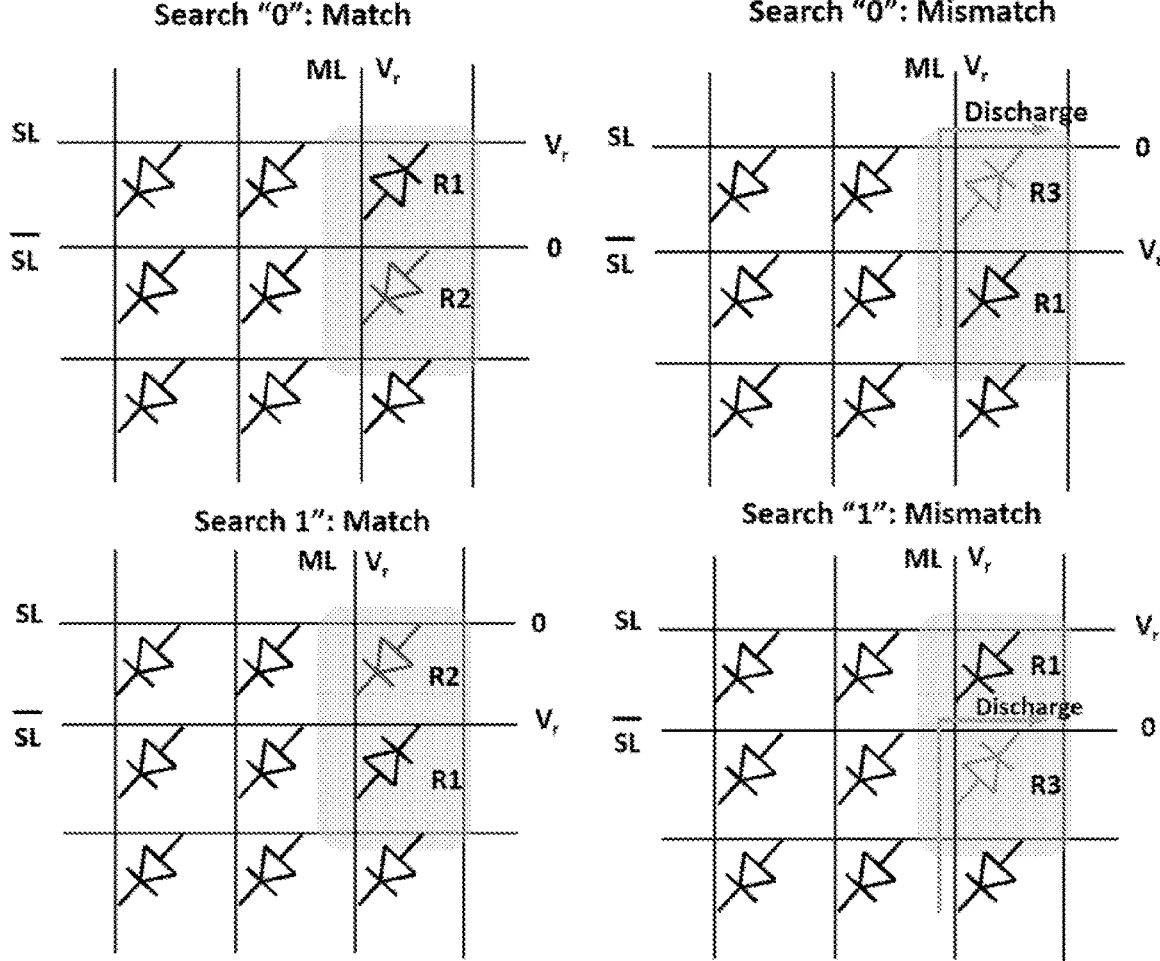

FIG. 27 illustrates a TCAM cell structure.

Figure 28:
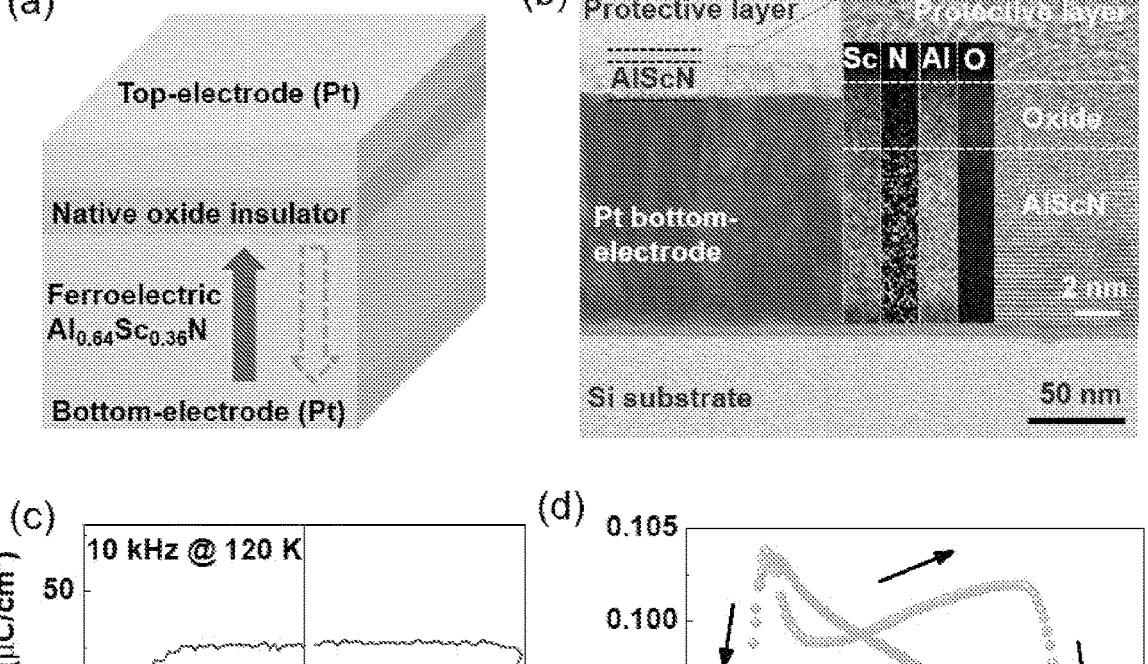

FIG. 28 illustrates a metal/oxide/$Al_{0.64}Sc_{0.36}N$/metal memristor device.

Figure 29:
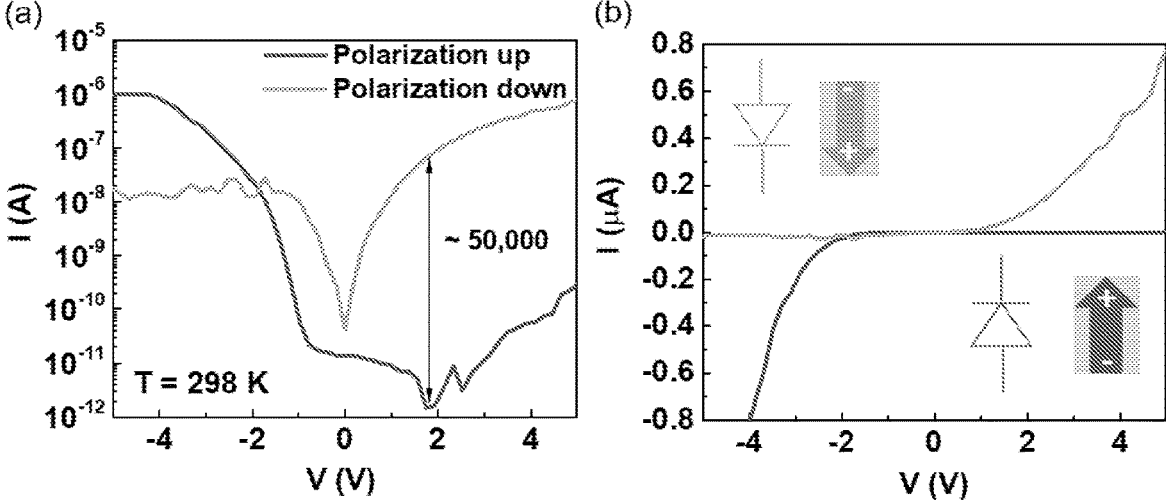

FIG. 29 illustrates current-voltage characteristics of a ferroelectric memristor.

Figure 30:
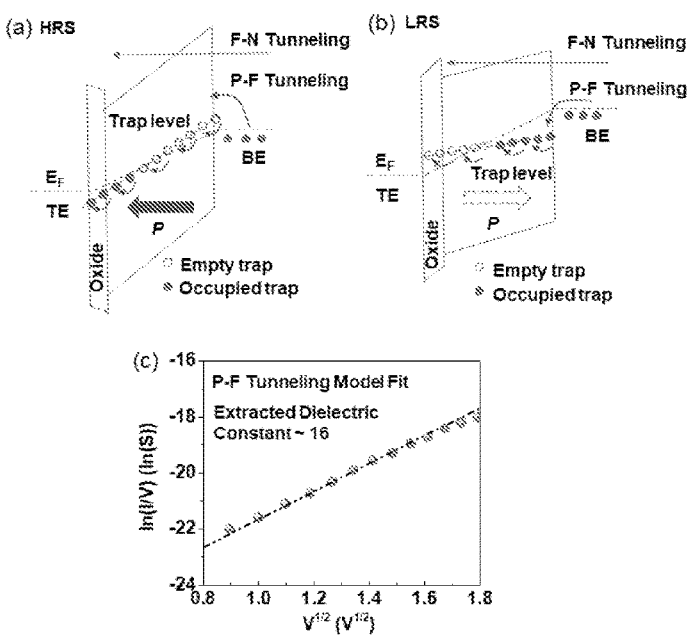

FIG. 30 illustrates characteristics of MIM devices.

Figure 31:
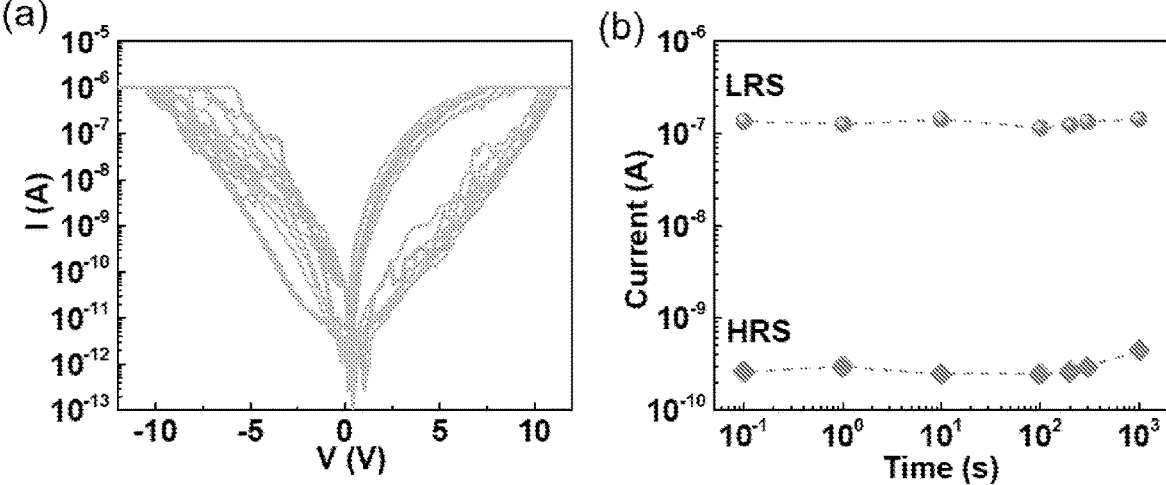

FIG. 31 illustrates cyclic I-V curves over manual DC switching cycles and retention of the low and high current/resistance states.

Figure 32:
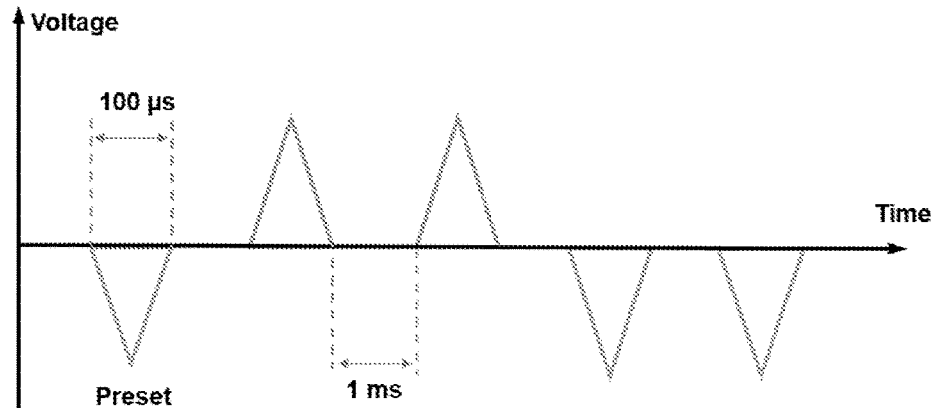

FIG. 32 illustrates a pulse sequence for PUND measurement.

Figure 33:
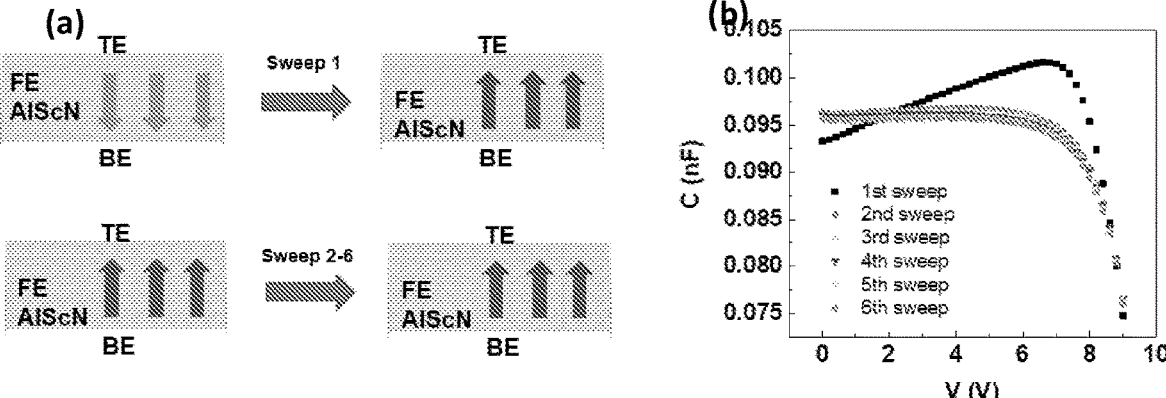

FIG. 33 illustrates ferroelectric (FE) AlScN metal-insulator-metal devices.

Figure 34:
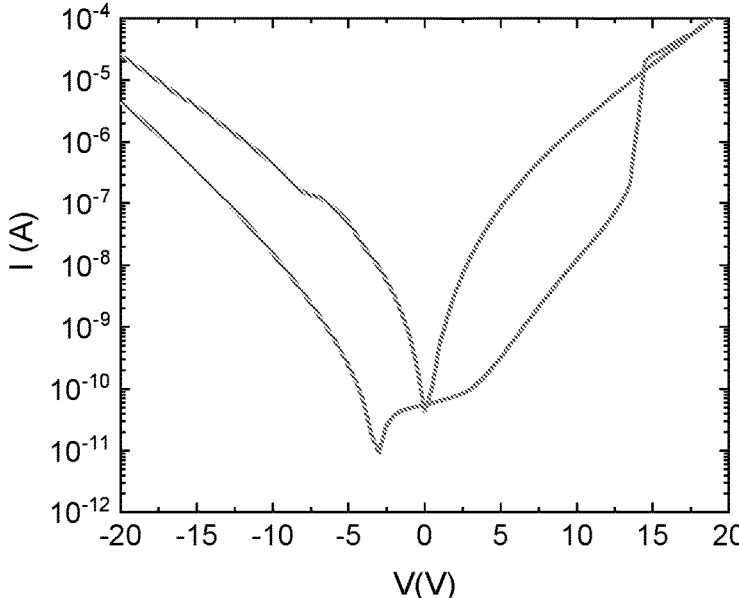
Figure 35:
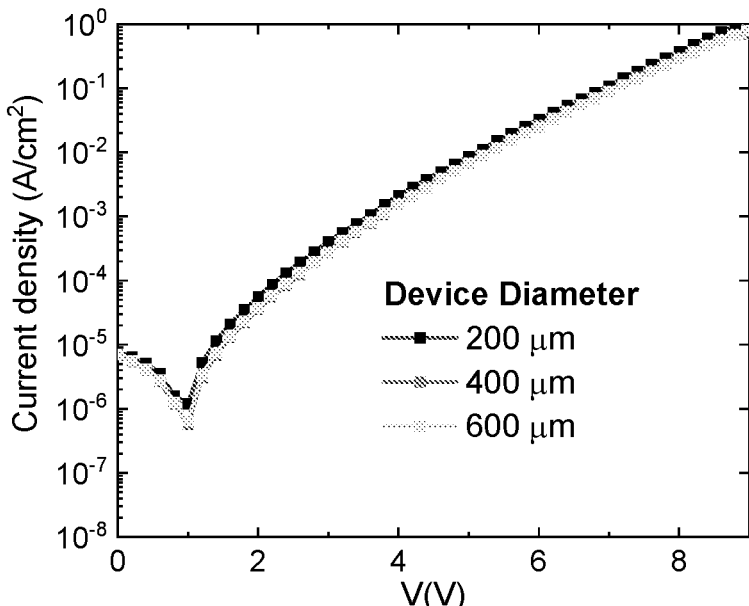

FIG. 34 illustrates I-V characteristics of an in-situ deposited MIM Al (30 nm)/$Al_{0.68}Sc_{0.32}N$ (45 nm)/Al (85 nm) ferrodiode device FIG. 35 illustrates On state sweeps of current density vs voltage for three circular Pt/native oxide/$Al_{0.64}Sc_{0.36}N$/Pt MIM devices.

DETAILED DESCRIPTION

There is increasing interest in new technologies and computational paradigms that enable faster and more energy-efficient information processing. This is because of the increasing difficulties in Moore's law scaling and the accompanying declines in performance. In-Memory-Computing (IMC) technologies based on non-volatile memory are developing rapidly, driven by applications such as big-data, internet of things and artificial intelligence (AI). These applications necessitate a reduction in the "distance" between computing and the data. See, Ielminiet et al., Nature Electron. 1, p. 333 (2018).

Figure 1:
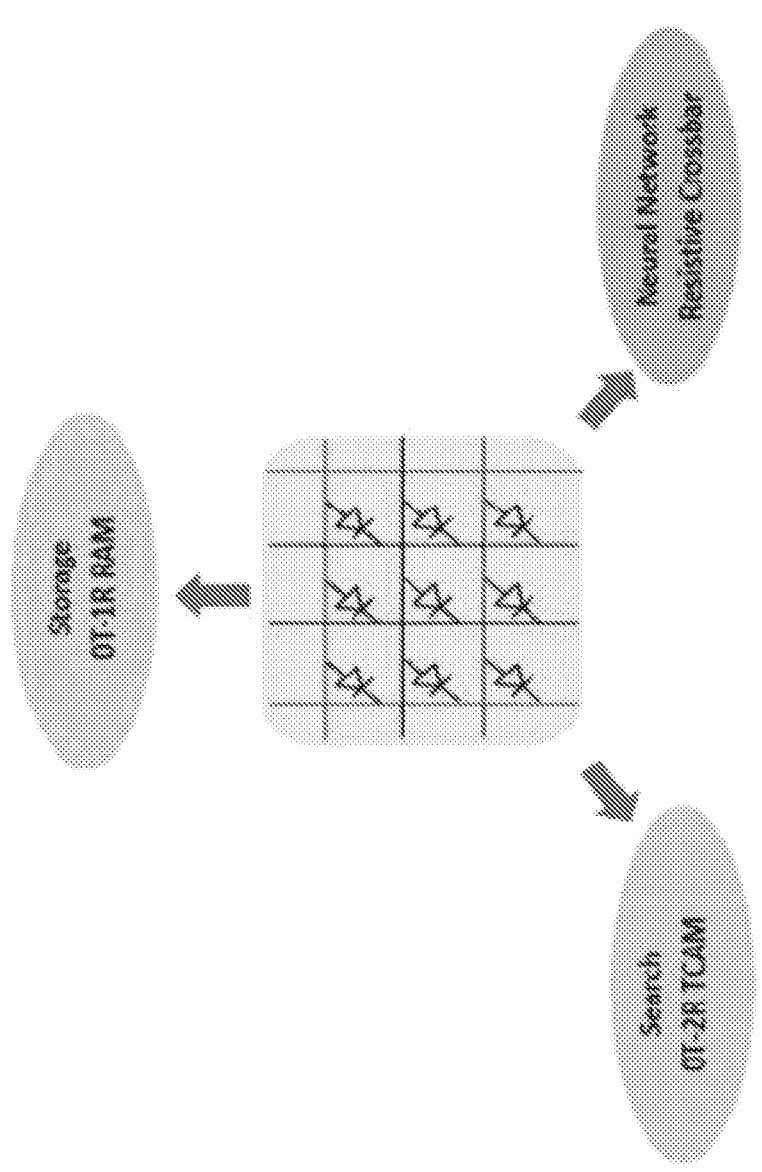
FIG. 1 illustrates the various potential uses of ferro-diode arrays for memory, search in memory, and neural networks.

However, AI computational tasks that exploit big data generally require more than one IMC architecture on the same chip in order to process information sequentially: namely on-chip storage, content search, and matrix multiplication engines. This has proven challenging thus far. In this paper, we show how our strategy has leveraged the unique characteristics of ferro-diodes made from an emerging ferroelectric material (AlScN). to build reconfigurable circuits and architectures with significant improvements w.r.t both areal density and speed for multiple data-intensive applications. See, Wang et al., IEEE EDL, 41, pp. 1774 (2020). We demonstrate three distinct architectures: 0T-1R for storage, 0T-2R for search, and crossbars for neural networks (FIG. 1).

Field-Programmable Ferro-Diode

Figure 2:
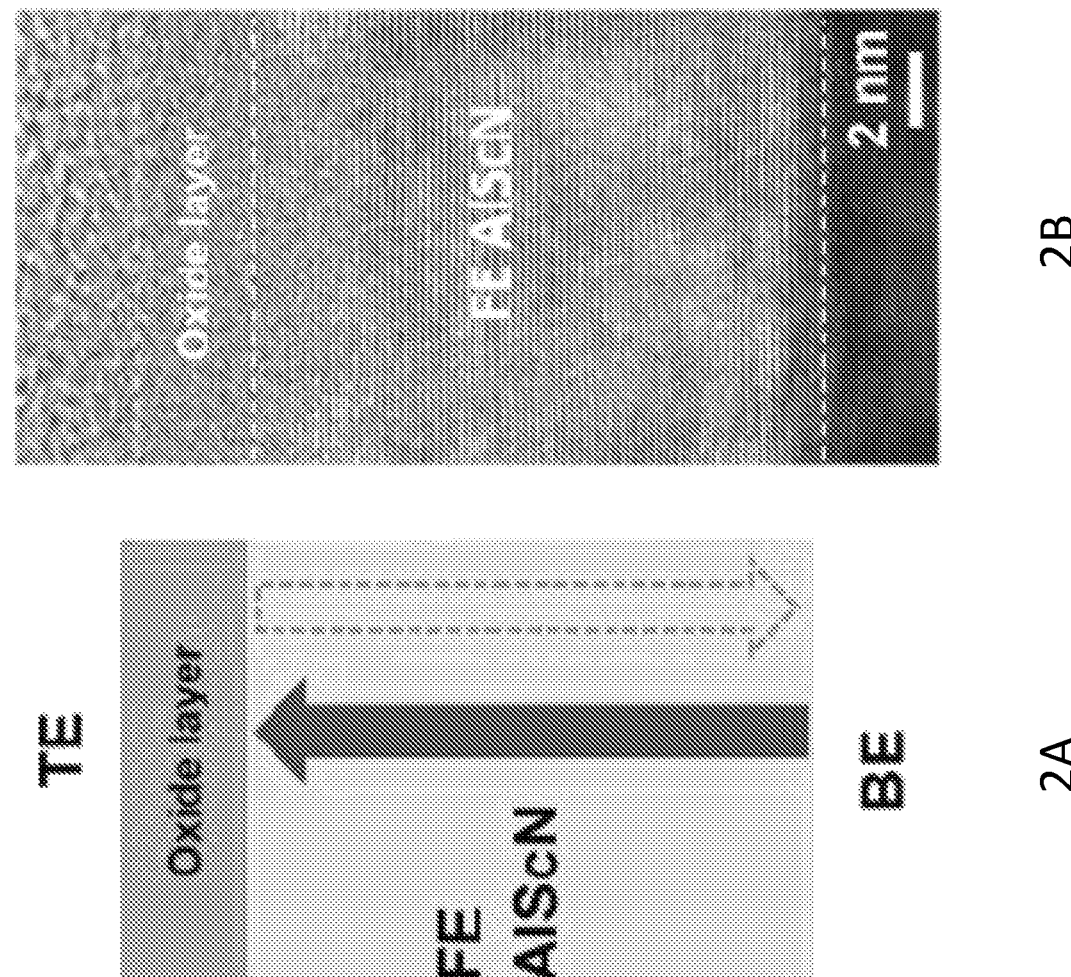
FIG. 2A is a diagram of a vertical cross-section of an example ferro-diode.
FIG. 2B is a TEM image a vertical cross-section of an example ferro-diode.
Figure 3:
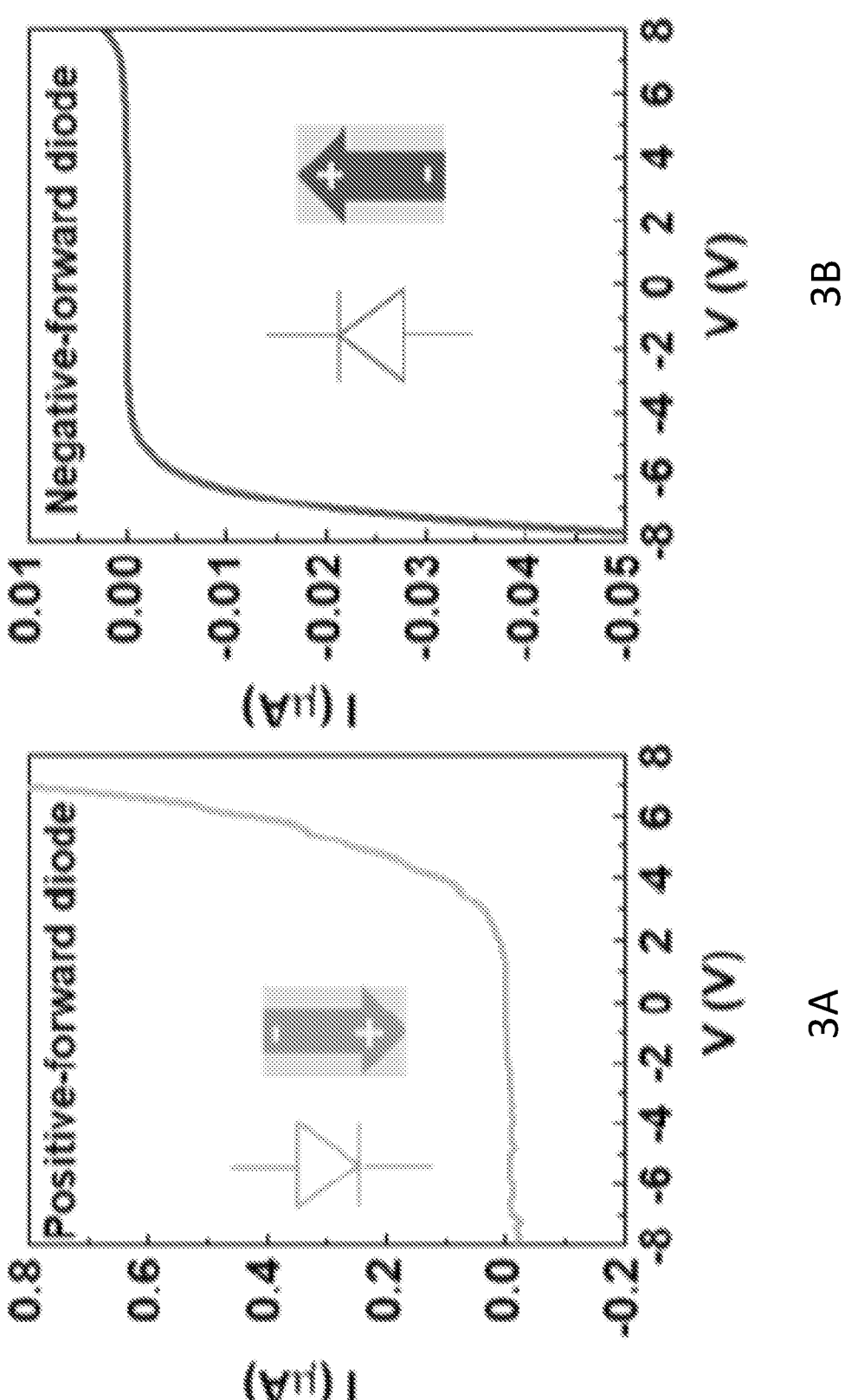
FIGS. 3A and 3B are I-V curves of an example ferro-diode in positive-forward and negative-forward polarization states, respectively.
Figure 5:
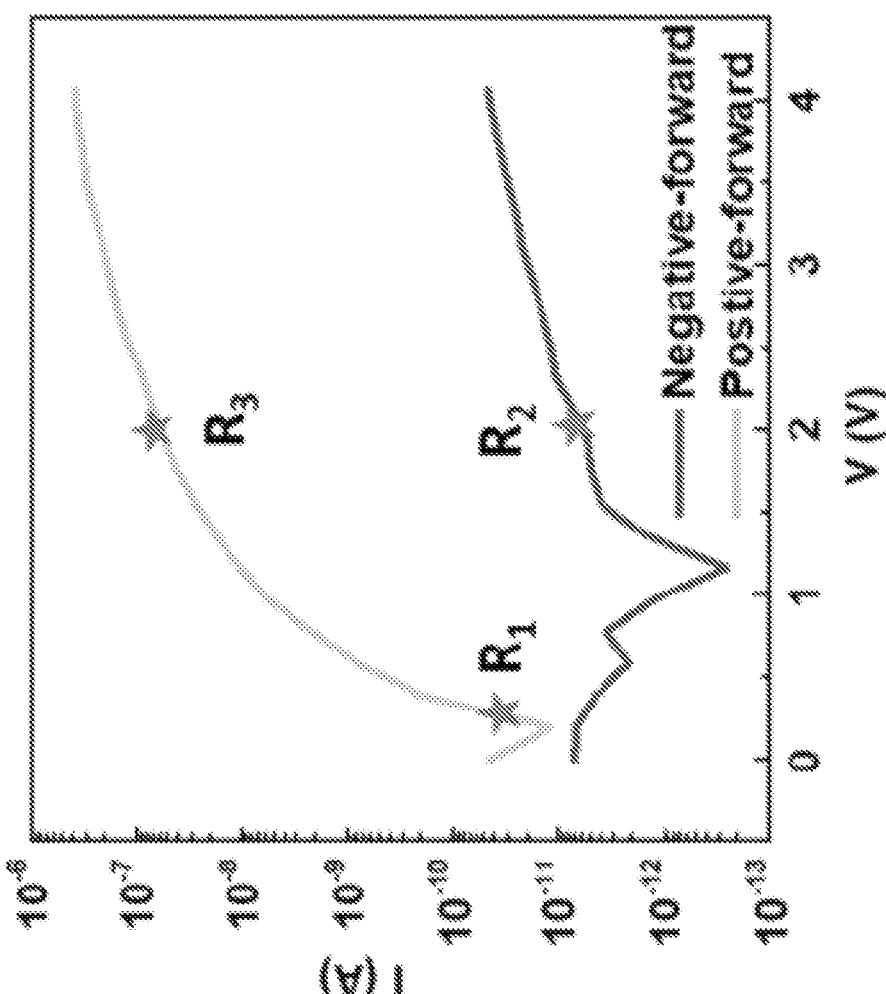
FIG. 5 shows two I-V curves of ferro-diodes in different polarization states.

Schematic and a cross-section TEM image of the ferro-diodes are shown in FIG. 2. A 20 nm AlScN film was co-sputtered on top of a Pt electrode at 350° C., followed by sputtering of a Pt (100 nm) metal top electrode. FIG. 3 shows the I-V curve of the positive-forward diode and negative-forward diode, with two opposite polarization states. Storage FIG. 5 shows the typical I-V characteristics of field programmable ferro-diodes. The device has a self-rectifying ratio over 104, which suppresses sneak currents without additional access transistors or selectors. See, Ielminiet et al., Nature Electron. 1, p. 333 (2018) A large On/Off ratio over 104 is obtained in this diode at a readout bias voltage ~2 V: this is at least two orders of magnitude above the On/Off ratio previously reported in hafnia-based memory cells. See, K. Ota, et al., in IEDM Tech. Dig., pp. 6.2.1-6.2.4 (2019). See also, Berdan, R al., Nature Electron. 3, p. 259 (2020).

Based on the high on/Off and self-rectifying ratio, the well-known V/2 scheme can be applied to the readout and programming of 0-T resistive crossbars. See further, Serb, A. et al, IEEE Trans. Circuits Syst. I 63, pp. 827-835 (2016).

Search

Figure 8:
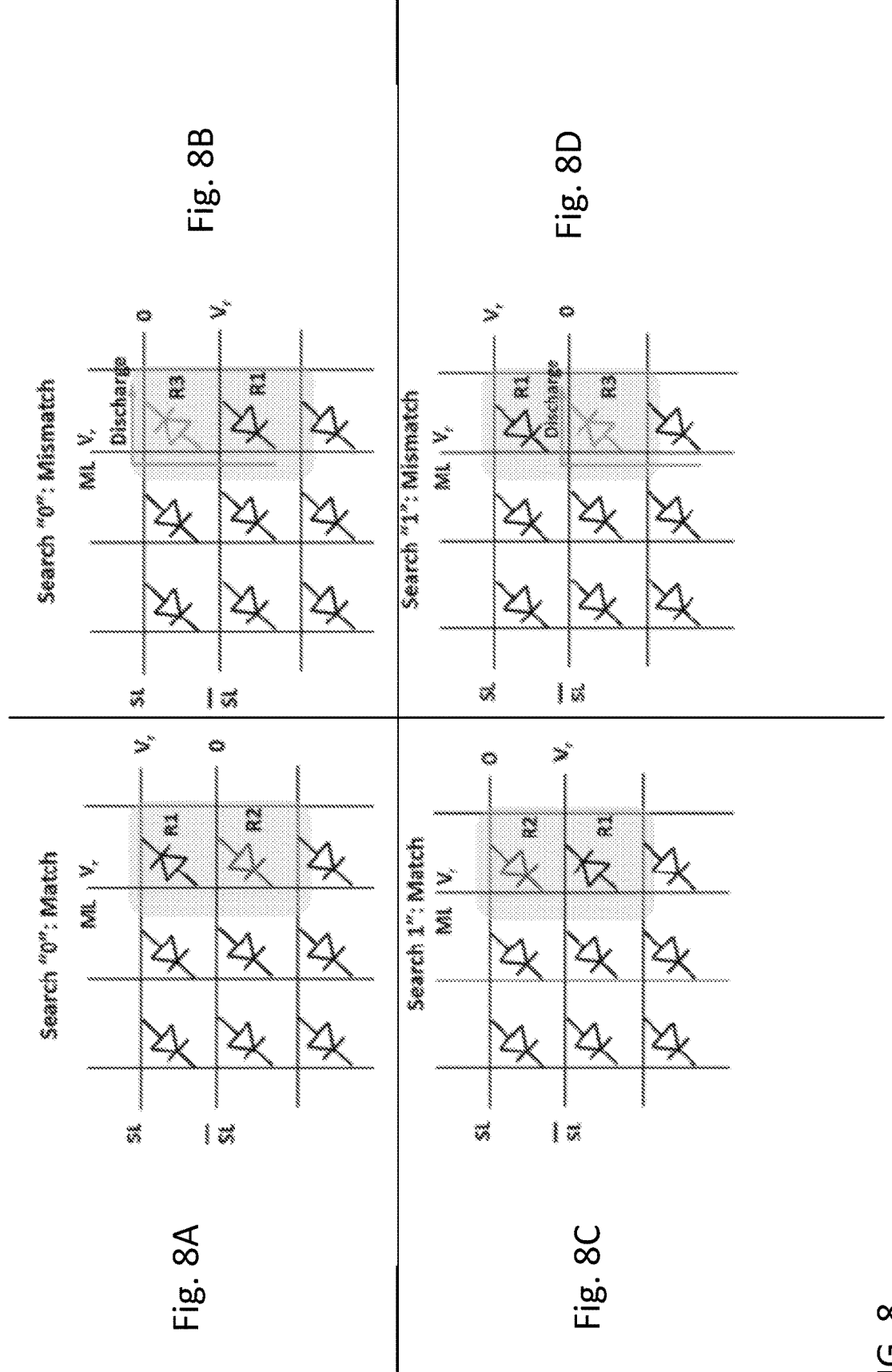
FIGS. 8A-8D illustrate the use of ferro-diode arrays for search modes. Implementation of the search modes may involve a high sense margin on match line resistance can be achieved by high on/off ration and self-rectifying.
Figure 9:
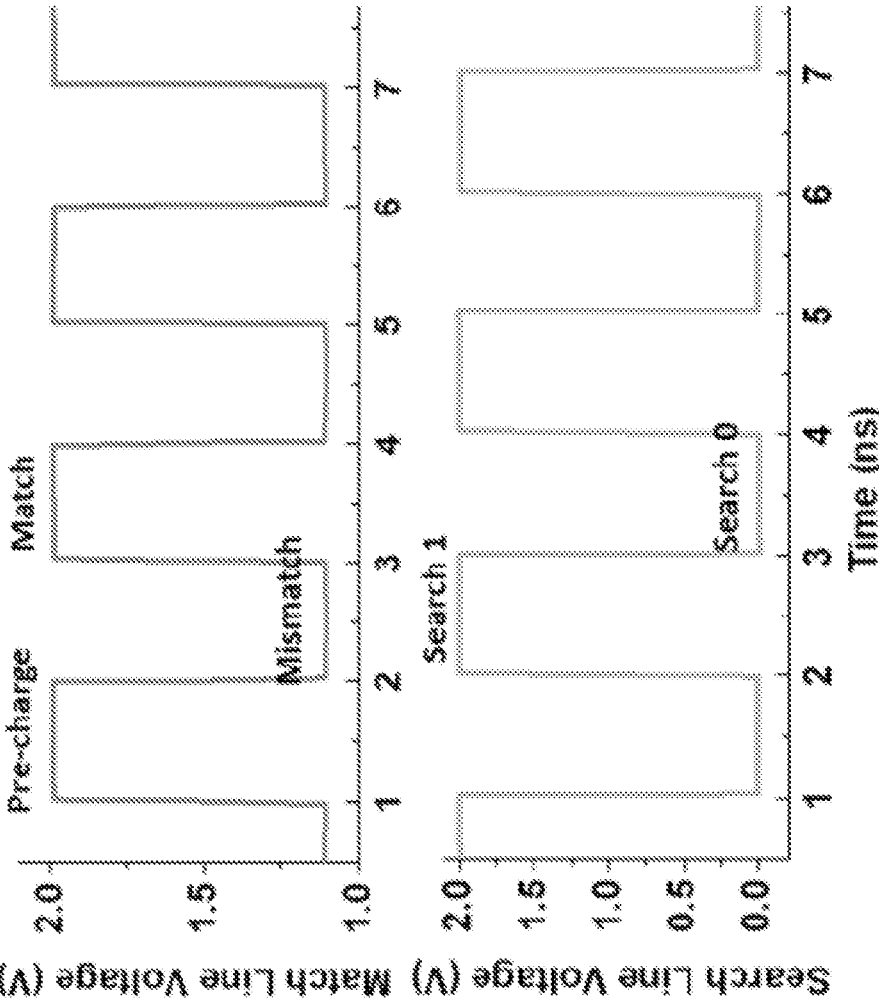
FIG. 9 show two graphs of voltage over time for search line voltage and match line voltage for a ferro-diode 0T-2R TCAM cell. The waveforms were generated in SPICE for the condition that state "0" is stored and being searched by two sense voltages. See, Y. LeCun et al., Proceedings of the IEEE, Volume 86, Issue 11, November 1998.
Figure 10A:
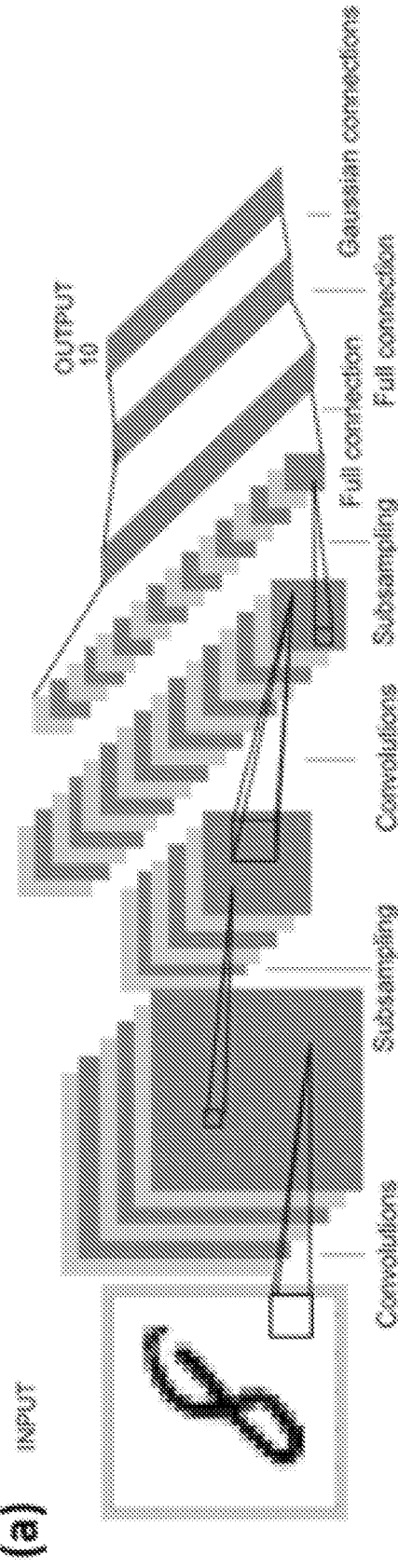
FIG. 10A is a schematic representation of LeNet-5. See, Y. LeCun et al.
Figure 10B:
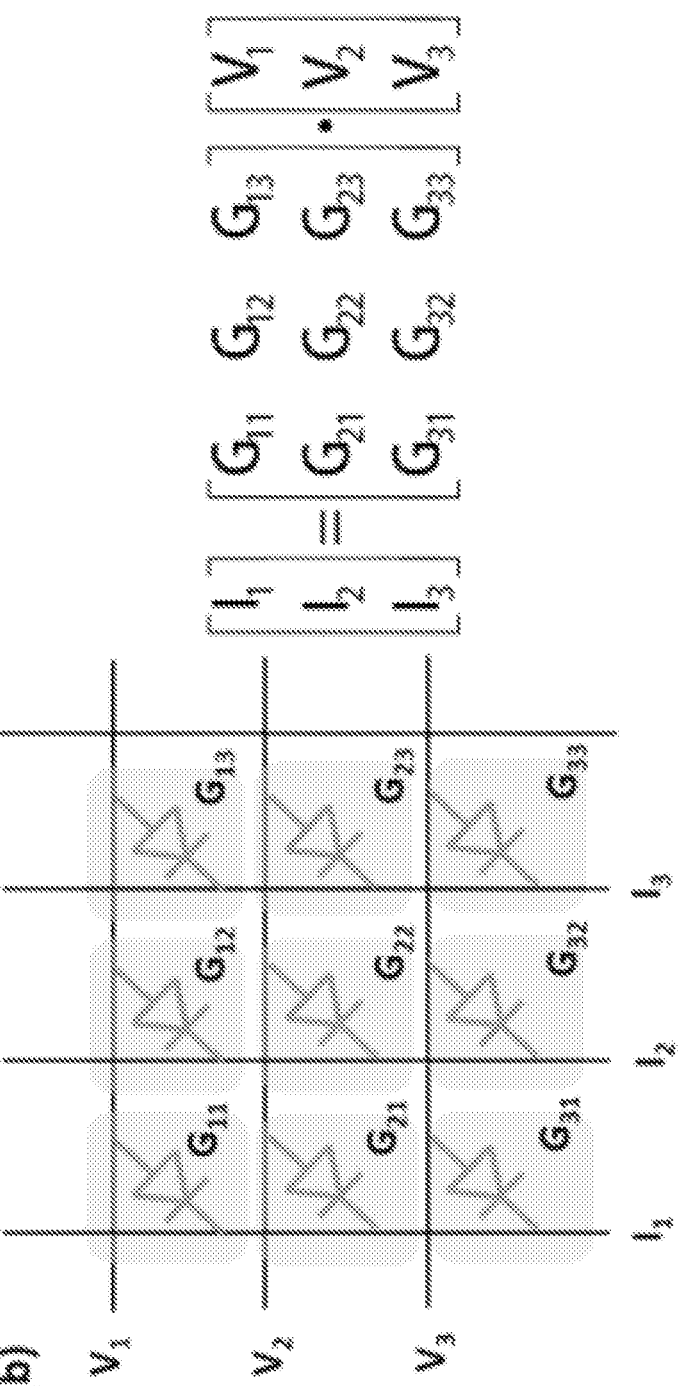
FIG. 10B illustrates a ferro-diode 0T-1R crossbar array to directly map a pre-trained CNN architecture.

In this work, the cell structure of TCAM can be significantly simplified by using two ferro-diodes (FIG. 6) connected in parallel but oppositely polarized. The basic principle can be described as follows: A discharge of ML can only happen if the ferro-diode is programmed to positive-forward and the read voltage is higher than the turn-on voltage. The operation of the 0T-1R ferro-diode TCAM cell is summarized in FIG. 7. During the cell operation, complementary states are first programmed into the two ferro-diodes. If the search data match with the stored information the ML remains high; otherwise, the ML discharges. In the SPICE simulation example (FIG. 9), we write the logic "0" state into the TCAM cell by setting the up/down ferro-diodes to a positive-forward/negative-forward state, respectively. Next, we search logic 0 by applying a low/high pulse amplitude to the up/down ferro-diodes. As shown in FIG. 8, for "Match", the ML resistance is R1//R2; for "Mismatch", the ML resistance is R1//R3≈R3. So that the sense margin is approximately expressed as (R1//R2)/R3. This means that simultaneously achieving a high on/Off ratio and a high self-rectifying ratio is essential for our 0T-2R TCAM design. Due to the non-existence of transistors, the SPICE simulation verified that the proposed TCAM has a very compact design in comparison to prior architectures based on transistors and a search delay below 100 ps in a 4×8 TCAM array. See, Li, J. et al., IEEE J. Solid-State Circuits 49, pp. 896-907 (2014). See also, K. Pagiamtzis et al, IEEE Journal of Solid-State Circuits 41, pp. 712 (2006). See further, Lin, C. C. et al. IEEE ISSCC, pp. 136-138 (2016).
Neural Network A highly linear and symmetric neuromorphic synaptic behavior of the reported ferro-diode can also boost its applications in deep neural network acceleration. See, Qiangfei Xia et al., Nature Materials. 18, pp. 309, (2019). An example of pulse response is illustrated in FIG. 11 where alternating polarity pulse trains are applied in sequence, showing the ferro-diode is capable of bipolar, pulse-number-dependent analogue state modulation. We also experimentally observe 4-bit ferro-diode synapse with highly linear and symmetric potentiation/depression characteristics, which enables applications in high-accuracy and low-latency neural network inference. We note that the highly linear and symmetric weights were programmed just by use of pulse trains with uniform height and width, which will significantly simplify the programming of this mem-resistive crossbar. This design is benchmarked by experimental ferro-diode data and LeNet-5 architecture in the PyTorch framework, which shows an inference accuracy ~97.5% on MNIST dataset, approaching the ideal software-level inference, shown in FIG. 12.
Aspects The following Aspects are illustrative only and do not limit the scope of the present disclosure or the appended claims.

Aspect 1. A memory cell, comprising an array of ferroelectric diodes, the ferroelectric diodes optionally comprising aluminum scandium nitride (AlScN) or hafnium zirconium oxide (HfZrO$_2$), the ferroelectric diodes being characterized as non-volatile and field programmable via pulsing to a pulse-number-dependent analog state.

Aspect 2. The memory cell of Aspect 1, wherein, the diodes have an on/off ratio greater than 2, 5, 10, 25, 50, 75, 100, 500, 1000, 5000, or 10,000.

Aspect 3. The memory cell of Aspect 1, wherein the diodes have a self-rectifying ratio greater than 25, 50, 75, 100, 200, 500, 1,000, 10,000, 50,000, or 100,000.

Aspect 4. The memory cell of Aspect 1, wherein the cell is compatible with CMOS back-end-of-line (BEOL) processing.

Aspect 5. The memory cell of Aspect 1, further comprising ferroelectric material comprising aluminum scandium nitride (AlScN) or hafnium zirconium oxide (HfZrO$_2$), the ferroelectric material having a deposition temperature of less than 400 degrees C.

Aspect 6. The memory of cell of Aspect 1, wherein the ferroelectric diodes are bipolar pulse programmable.

Aspect 7. The memory cell of Aspect 6, wherein the ferroelectric diodes are pulse programmable to a 4-bit resolution of states.

Aspect 8. The memory cell of Aspect 1, wherein the diodes comprise an AlScN or HfZrO$_2$ layer having a thickness of less than about 100 nm, less than about 75 nm, less than about 50 nm, or less than about 25 nm.

Aspect 9. An array of memory cells, comprising plural instances of the memory cell of any of Aspects 1-8, the array being arranged for a V/2 scheme that is used to readout and to program the ferroelectric diodes.

Aspect 10. A Ternary Content Addressable Memory (TCAM), comprising: a memory cell of any one of Aspects 1-8.

Aspect 11. The TCAM of Aspect 10, the TCAM having a search delay of less than about 1 µs, less than about 500 ns, or even less than about 100 ns, 50 ns, 10 ns, 1 ns, or 100 ps.

Aspect 12. The TCAM of any one of Aspects 9-11, wherein each memory cell comprises two diodes that are oppositely polarized.

Aspect 13. A neural network, comprising an array of multi-bit diode synapses, wherein each diode synapse optionally comprises a ferroelectric diode comprising aluminum scandium nitride (AlScN) or hafnium zirconium oxide (HfZrO$_2$), and wherein each diode is non-volatile and field programmable via pulsing to a pulse-number-dependent analog state.

Aspect 14. The neural network of Aspect 13, wherein the multi-bit diode synapses are arranged in an LeNet-5 architecture in a PyTorch framework Aspect 15. The neural network of Aspects 13 or 14, wherein the neural network exhibits an inference accuracy of at least about 90%, at least about 95%, or at least about 97% on a MNIST dataset.

Example: Reconfigurable Compute-In-Memory on Field-Programmable Ferroelectric Diodes The deluge of sensors and data generating devices has driven a paradigm shift in modern computing from arithmetic-logic centric to data centric processing. At a hardware level, this presents an urgent need to integrate dense, high-performance, and low-power memory units with Si logic-processor units. However, data-heavy problems such as search and pattern matching also require paradigm changing innovations at the circuit and architecture level to enable compute in memory (CIM) operations. CIM architectures that combine data storage yet concurrently offer low-delay and small footprint are highly sought after but have not been realized. Here, we present Aluminum Scandium Nitride (AlScN) ferroelectric diode (FeD) memristor devices that allow for storage, search, and neural network-based pattern recognition in a transistor-free architecture. Our devices can be directly integrated on top of Si processors in a scalable, back-end-of-line process. We leverage the field-programmability, non-volatility, and non-linearity of FeDs to demonstrated circuit blocks that can support search operations in-situ memory with search delay times<0.1 ns and a cell footprint<0.12 µm$^2$. In addition, we demonstrate matrix multiplication operations with 4-bit operation of the FeDs. Our results highlight FeDs as promising candidates for fast, efficient, and multifunctional CIM platforms.

The convergence of big-data with artificial intelligence (AI) has led to multiple emerging technologies across a range of computing applications. The increasingly ubiquitous presence of sensors and edge/IoT devices has created a flood of data, which has exposed a wide efficiency gap in computing hardware, ranging from mobile and edge devices to data centers and cloud computing hardware. In addition, the slowdown in the miniaturization of silicon-based complementary metal-oxide-semiconductor (CMOS) devices further accentuates the gap between resource requirements based on conventional von Neumann computing hardware architectures, specifically the central processing unit (CPU), graphics processing unit (GPU), and field-programmable gate arrays (FPGA). Furthermore, it is well-known that for many data-centric tasks in such von Neumann architectures, most of the energy and time is consumed in memory access and data movement, rather than in actual computation. Several solutions have been proposed to mitigate and overcome this bottleneck, with a prominent one being placing memory and logic units in close physical proximity. While significant progress has been made along those lines at both materials and device levels, a transformative approach would be to perform computing functions using in-situ memory. This is popularly known as compute-in-memory (CIM). The overarching goal of CIM is to radically transform the computing architecture by completing computations in-situ, exactly where the data are stored, instead of re-engineering conventional von Neumann architecture by individual optimizations in memory bandwidth, novel non-volatile memory (NVM) technology, and data parallelism. While several demonstrations of CIM architectures using NVMs have been made, the bulk of the effort has been constrained to a single type of computing task, an example being matrix multiplication accelerators, typically achieved using memristive crossbar arrays. However, AI computational tasks that exploit 'big-data' generally require more than one data-intensive computational operation on the same chip, preferably using the same architecture to process information in the pipeline. Three of the most important functions or operations are: 1) on-chip storage, 2) parallel search, and 3) matrix multiplication. A key challenge in the construction of CIM architectures is the conflicting trade-off between the performance and the flexibility required to achieve these three functions. Consequently, while CIM accelerators have been demonstrated that can achieve high performance on matrix multiplication acceleration, they are are fundamentally ill-suited for other big data operations such as parallel search. Hence, it is important to conceptualize and develop reconfigurable and operationally flexible hardware for CIM to simultaneously support essential data operations such as on-chip memory, parallel search and matrix multiplication acceleration.

In this work, we leverage the unique characteristics of aluminum scandium nitride (AlScN) ferroelectric diodes (FeD) devices—specifically their field-programmability, non-volatility, and non-linearity—and demonstrate circuit blocks based on FeD devices which support multiple, essential primitive data operations in-situ memory in a transistor free design (FIG. 11). Specifically, first, we demonstrate FeD devices which are non-volatile and show self-rectifying behavior with a non-linearity$>10^6$, a high ON/OFF ratio over $10^2$, endurance over $10^4$ cycles and field-programming speed faster than 500 ns, and which are compatible with CMOS back-end-of-line (BEOL) processing. Then, we exploit these unique properties and demonstrate a non-volatile ternary content addressable memory (TCAM) using 0-transistor/2-FeD cells. These serve as a key building block in hardware implementation of in-memory computing for the parallel search process in big data applications. This transistor-free approach is a key merit of our device and memory cell design. Consequently, the 2-FeD TCAMs have the most compact design known (0.12 $\mu m^2$/cell for 45 nm node), along with a significantly reduced search delay (<0.1 ns for 45 nm node) compared to 2-transistor/2-resistors (2T-2R) based TCAM cells, as evaluated using integrated circuit emphasis (SPICE) simulations. Finally, we also show that FeD devices can be programmed into 4-bit, distinct, conductive states with superior linearity and symmetry via electrical pulsing. Using this programmable, multi-bit attribute of the ferrodiodes, we demonstrate a hardware implementation of neural network computation in the form of analog voltage-amplitude matrix multiplication, which is a crucial kernel in neural network computation. We demonstrate accuracies approaching ideal, software-based, neural networks. The matrix multiplication operation is benchmarked by mapping neural network weights to experimental FeD conductance states in a convolutional neural network architecture for both inference and the in situ learning task, and shows that our accuracies approach ideal software-level simulation on the MNIST dataset. Our results indicate that the AlScN-based, field-programmable, non-volatile FeDs offer unique opportunities to build reconfigurable CIM architectures with superior balance between performance and flexibility.

Field-Programmable AlScN FeDs for Memory

Our FeD devices consist of a 45-nm thick layer of a sputter-deposited, ferroelectric AlScN layer sandwiched between top and bottom aluminum electrodes. This forms a metal-insulator-metal (MIM) structure, as shown in the left panel of FIG. 12a. AlScN is a recently discovered ferroelectric material with nearly ideal ferroelectric hysteresis loops, record values of remnant polarization, and a composition-tunable coercive field. Furthermore, it can be integrated directly in a CMOS BEOL-compatible process technology over 8-inch wafers. It has also been shown to be one of the most promising candidates for high-performance ferroelectric memory devices, scalable down to <10 nm in thickness. The AlScN films were characterized electrically and exhibit large coercive fields, $E_C$, of 2-4.5 MV/cm. This is important for scaling to thinner ferroelectric layers, all while maintaining a large memory window, high ON/OFF ratio, and good retention. When combined with high measured remnant polarizations—$P_r$ of 80-150 $\mu C/cm^2$—this leads to a significant tunneling electro-resistance effect, based on strong tunnel barrier modulation, thus giving a high ON/OFF ratio. Additional details of film deposition, characterization and device fabrication are provided in methods and supplementary information. FIG. 12(a) presents a representative cross-section transmission electron microscopy (TEM) image of the MIM FeD device comprised of an AlScN film with an Al top electrode, deposited on Al/AlScN/Si substrate. An atomic-resolution TEM image of the AlScN film is shown in FIG. 12(b1). FIG. 12(b2) shows ~2 nm thick interfacial layer at AlScN/bottom Al interface.

FIG. 11 illustrates reconfigurable CIM on field-programmable ferroelectric diodes. a, Schematic diagram of FeD devices in a cross-bar structure with up and down polarization of the ferroelectric AlScN. The field programmability, non-volatility and non-linearity of these devices can be leveraged for multiple, primitive data operations such as storage, search, and neural networks without the need for additional transistors, as shown in b-d. b. The two-terminal FeD devices show a diode-like self-rectifying behavior with non-linearity $>10^6$ concurrently with a ON/OFF ratio over $10^2$ and endurance over $10^4$ cycles, making FeD devices well placed in the memory hierarchy for storage. In addition, the high non-linearity can suppress sneak currents without the need for additional access transistors or selectors. C. For search operations, a non-volatile TCAM can be built upon 0-transistor/2-FeD cells, which serves as a building block in hardware implementation of in-memory computing for parallel search in big data applications. D. For neural networks, FeD devices can provide programmability to distinct multiple conductive states with a high degree of linearity with respect to number of electrical pulses. This allows mapping the matrix multiplication operation, a key kernel in neural-network computation, into reading the accumulated currents at each bitline of a FeD device by encoding an input vector into analog voltage amplitudes and the matrix elements into conductances of an array of FeD devices.

The ferroelectric response of the 45 nm AlScN thin film was characterized by a positive-up, negative-down (PUND) measurement on a circular metal/ferroelectric/metal capacitor with radius of 25 $\mu m$, using a square wave with 2 $\mu s$ delay and pulse widths of 400 ns See FIG. 25. PUND testing is preferred over a polarization-electric field hysteresis loop (P-E loop) measurement because the P-E loop of 45 nm AlScN shows a polarization-dependent leakage which hinders the observation of polarization saturation for positive applied fields that switch the material into the metal-polar state. The PUND result indicates a remanent polarization ~150 μC/cm², as shown in FIG. 12c, and in agreement with prior observations. To further verify the ferroelectric switching, a dynamic current response was carried out, in which peaks corresponding to ferroelectric switching were observed. See FIG. 26. To further characterize the memory effect and reliability, we performed endurance tests between the positive and negative polarization states, as shown in FIG. 12d. FIG. 12d presents remanent positive and negative polarization extracted from 20,000 PUND cycles. Cyclic set/reset operations of the same AlScN FeD device indicate that both positive and negative polarization states are stable and rewritable for a significant number of cycles. As shown in FIG. 12e, we repeatedly set/reset the FeD device between the low resistance state (LRS) and high resistance state (HRS) by applying negative/positive voltages on the top electrode while grounding the bottom electrode, for 100 cycles, using quasi d.c. voltage sweeps. The FeD device shows ultralow operating current and self-rectifying behavior with non-linearity >10⁶ between 9 V and 0 V, which helps suppress sneak currents without the need for additional access transistors or selectors. The distributions of LRS and HRS resistances are summarized in FIG. 12f showing a tight distribution on the cycle-to-cycle variation of the ratio between the LRS and HRS.

FIG. 12. Room-temperature electrical characterization of AlScN/MoS₂ FE-FETs. a, 3D schematic illustration of the AlScN FeD device and cross-sectional TEM image of the AlScN FeD, showing 45 nm AlScN as the ferroelectric switching layer. b, The high-resolution phase-contrast TEM image obtained from the denoted regions (1) and (2) in (a) where the atomic structure of the ferroelectric and interface are visible. c, PUND results of a 45 nm AlScN thin film with a pulse width of 400 ns and 2 μs delay between pulses. The PUND test reveals a saturated remanent polarization of 150 μC/cm². d, The extracted remanent polarizations from PUND measurements during the endurance test of AlScN films using 1.5 μs pulse width and 26 V amplitude. e, 100 cycles of program and erase measurements over the 45 nm AlScN-based FeDs. f, Distribution of HRS and LRS resistances during program and erase measurements in e.

2-FeD TCAM Cell for Search

Next we focus on CIM circuit architectures and computing applications comprising the above-described FeDs serving as non-volatile memories. We first demonstrate a TCAM implementation using our FeDs. TCAM is a key building block in hardware implementation of CIM for fast and energy-efficient parallel searches in big data applications. TCAM performs the search function by comparing the input data with the stored data in the memory array in parallel, and returning the data address when a match is detected. Such parallel search allows TCAMs to perform a look-up table function in a single clock cycle. Unlike a binary content-addressable memory cell, which stores bit values of either '0' or '1', a TCAM cell can store an additional 'X' ('don't care') bit, which results in a match state regardless of the input search data, and makes TCAM much more powerful in searching applications. However, in conventional Si CMOS architecture multiple transistors (~16) are required to construct a single TCAM cell with static random-access memories (SRAMs) (FIG. 13a). This configuration results in large footprints and high-power consumption due to charging and discharging of the transistor and due to interconnect parasitic capacitances. This limits the use of this configuration in high speed, massive scale, and power-constrained systems. Non-volatile memories (NVMs) are promising alternatives for implementing TCAMs as they are more area- and energy-efficient. This is because they form a single TCAM cell in a more compact architecture and because they retain stored information even if power is removed. TCAMs based on resistive random-access memories (RRAMs), magnetic tunnel junction (MTJ) RAMs, floating gate transistor memory (FLASH), and phase change memories (PCMs) have already been demonstrated. However, all of those architectures are still constructed on top of front-end-of-line transistors and none of them are fully BEOL compatible.

In this work, the cell structure of TCAM can be significantly simplified by using just two FeDs, which does not require the incorporation of a transistor due to the large non-linearity of the FeDs (FIG. 13a). The operation of the single FeD TCAM cell is demonstrated in FIG. 13b. The cell structure makes it natural to utilize the FeD crossbar memory array, in which the signal lines connecting to the anode and to the cathode are in parallel in a bit-search for the TCAM demonstration, as shown in Supplementary FIG. 17. First, we discuss how the FeDs based TCAM stores and searches a '0' or '1' bit (FIG. 13b). During the cell operation, complementary states are first written into the two FeDs, and if the search data biased on search lines (SL and $\overline{SL}$) matches with the stored information, the match line (ML) remains high; otherwise, the ML is pulled down. As we have shown supra vide, the FeD devices are highly self-rectifying and sustain high ON/OFF ratios. Thus, a discharge on the ML can only happen if the FeD is programmed to a low resistance state and the read voltage is higher than the turn-on voltage of the FeD.

As shown in FIG. 13b, we write the logic '1' state into the FeD TCAM cell by setting the left/right FeD to a low-resistance/high-resistance state, respectively. During the search operation, the match lines are biased by a read voltage $V_S$ which is higher than the turn-on voltage of the FeD. Next, we search logic '1' by applying a high/low voltage to the left/right FeD, respectively, and search logic '0' by applying a low/high to the left/right FeD, respectively. In this context 'high voltage' refers to the read voltage $V_S$, which is higher than the turn-on voltage of the FeD, but is lower than the write voltage. Conversely, a 'low voltage' refers to a read voltage near zero, much lower than the turn-on voltage of the FeD. Since the left FeD is in parallel with the right FeD, a match state is observed only if both of the FeDs in a cell are cut-off (FIG. 13b, left panel). Based on these write and search schemes, when the stored data and search data match (as shown in the left panel in FIG. 13b, the stored bit is logic '1' and the search bit is logic '1'), the FeD with the low-resistance state is turned-off, as the voltage drop between its anode and cathode is near zero and lower than its turn-on voltage. Further, the FeD with the high-resistance state is also cut-off, because the current is naturally low when passing through the FeD in the high-resistance state. Therefore, the discharge currents at the two channels are both minimal and the ML stays high. However, when search data do not match the stored data, even though the right FeD with the high-resistance state is still cut off, the left FeD is not. The left FeD with the low-resistance state is turned-on as the voltage drop between its anode and cathode is $V_S$ and is higher than its turn-on voltage. Therefore, the discharge current is significant and the ML voltage is low (FIG. 13b, middle panel). We also demonstrate a ternary 'don't care' state in the two FeD-based TCAM. As shown in the right panel of FIG. 13b, we write the logic 'don't care' state into the FeD TCAM cell by setting the left/right FeD both to a high-resistance state. With the above write schemes and the same search schemes as logic '1' and '0', whatever signals arrive at the two FeDs, both the FeDs are always cut off as they are in the high-resistance state. FIG. 13$c$ shows repeated quasi-DC reading of the resistance of the two FeD-based TCAM cell for both match and mismatch states between the search data and the stored data bit '1', using moderate search voltages of 7 V on FeDs. FIG. 13$d$ shows repeated quasi-DC reading of the resistance of the two FeD TCAM cell for the stored data bit 'Don't care', using both query bit '1' and '0'. This shows that for both queries, the ML resistance of the two FeDs-based TCAM remains high and thus no discharging occurs through any of the two FeDs. Hence, the TCAM cell with two FeDs is fully functional with all three states. The full look up table of the two FeD-based TCAM cell is summarized in Supplementary Table. 1.

Conventional two-terminal NVMs (memristors) are always paired together with a front-end transistor to construct TCAM cells. This is because transistors are required to cut-off the channel, as they are in series with the two-terminal NVMs. The FeD-based design benefits from a high self-rectifying ratio which cuts off the channel without the need for any transistors. In other words, the FeD abstracts the functionality of the transistors into its self-rectifying behavior. The absence of a transistor leads to smaller cell footprints and area efficiency, and increases the search speed of the FeD-based TCAM. Using a SPICE simulation, we verify that the search delay in our FeD-based TCAM is reduced in comparison to prior TCAM architectures based on 2-transistors-2-resistors (2T-2R). A benchmark comparison chart of lateral footprint of various TCAM cells vs. search delay is shown in FIG. 13$e$. The superior performance of our two FeD-based TCAM of over CMOS SRAM and other transistor+NVM devices based architectures is evident.

The sensing margin of our FeDs-based TCAM is a function of both the self-rectifying ratio and the ON/OFF conductance (or current) ratios. Per our detailed compact model (See supplementary note 1) the ON/OFF ratio of a FeD can be further improved by integrating a non-ferroelectric insulator on top of the ferroelectric layer and engineering both the thickness ratio between these ferroelectric and non-ferroelectric insulator layers as well as the coercive field of the ferroelectric layer. Future studies will focus on further improving the sense margins by engineering these variables.

FIG. 13. 2-FeD TCAM cell for search operation a, A box schematic representation of a TCAM cell with match line (ML), search line (SL) and search line (SL bar) electrodes (left). Circuit diagrams of a single 16 transistor (16T) TCAM cell based on CMOS volatile static-random-access-memory (SRAM) technology, and 2-transistor-2-resistor (2T2R) TCAMs based on resistive storage elements such as PCM and RRAM. (center). The two ferrodiode-based TCAM cell proposed in this work (right) significantly simplifies the TCAM design by using two FeDs connected in parallel but oppositely polarized. b, Operation of a single TCAM cell comprising 2 FeDs for "match", "mismatch" and "don't care" states. c, Repeated quasi-DC reading of the resistance of the two FeDs TCAM cell for both match and mismatch states between the search data and the stored data bit '1', showing a >100× difference over ML resistances. d, Repeated quasi-DC reading of the resistance of the two ferro-diodes TCAM cell for the stored data bit 'Don't care', using both query bit '1' and '0', which turns out that for both two queries the ML resistance two FeDs TCAM is high and thus no discharging through any of the two FeDs. e, A benchmark comparison chart of lateral footprint of TCAM cells in various memory technologies vs search delay. A single FeD area of 0.0081 $\mu m^2$ is assumed for this estimate.

Neural Network

Next we focus on the application of our FeD device arrays for deep neural network (DNN) inference, which involves repeated matrix multiply/accumulate (MMAC) operations. MMAC operations and DNNs are typically implemented at the software level. However, their software implementation makes it particularly challenging to deploy them in power and resource contrained devices or environments. Once again, this is in large part due to the traditional von Neumann computing hardware approaches, which are intensive in terms of memory access and are difficult to parallelize. Conducting MMAC operations in the analog domain offers a promising alternative: memristors with analog conductances have been shown to be a superior hardware medium in which to perform MMAC operations. By leveraging Kirchhoff's current law's (KCL's) high parallelism, the MMAC operation can be significantly reduced to reading the accumulated currents in a single time clock at each bit-line of a memristor. This is accomplished by encoding an input vector into analog voltage amplitudes and matrix elements into conductances of the memristor array.

The ideal MMAC-suitable memristive devices should perform linearly arranged conductance values over electrical programming, linear dependence of current on the drive voltage, and high resistance to suppress the amount of current. Prior research in this domain has primarily focused on memristive devices which exhibit excellent ohmic behavior and a large number of conductance states, such as RRAM and PCM. In the context of DNN inference accuracy, a linear relationship between current and voltage is necessary to minimize the distortion of the input datum and a large number of conductances will minimize the precision loss on the weight matrix, which are essential to perform a highly accurate inference task. However, from the power and areal efficiency point of view, an excellent ohmic behavior and a large number of conductance states will hurt the architecture metrics for power efficiency and low latency per computation. There are a few reasons for this. First, memristive devices with excellent ohmic behavior come at the cost of high device conductance, meaning that high operating currents impose limitations on array scaling. Second, a large number of conductances will correspondingly require high precision analog-to-digital converters (ADCs). It is already known from prior work that the energy and area costs are dominated by the ADCs on a circuit level in memristor array systems. Therefore more conductance states means more power overhead at the architecture level in a DNN inference engine. Thus, there is an obvious trade-off between the DNN inference accuracy with the power and area efficiency. Here we show that FeD memristors can be used to perform an optimal trade-off between these metrics. First, to realize the trade-off on the device conductance, it is important to decrease the operating conductance of memristive devices while maintaining linear behaviour. The former condition is readily met for highly self-rectifying devices, an inherent property of the FeDs; the latter condition can be met by applying a encoder on the input voltage amplitudes to linearize the current-voltage relationship (See Supplementary Note 2). Second, to relax the trade-off on the number of conductance states, a few but sparsely and linearly arranged conductance states are necessary. This approach can achieve equivalent inference accuracy in comparison to approaches implementing a large number of conductance states.

Figure 4:
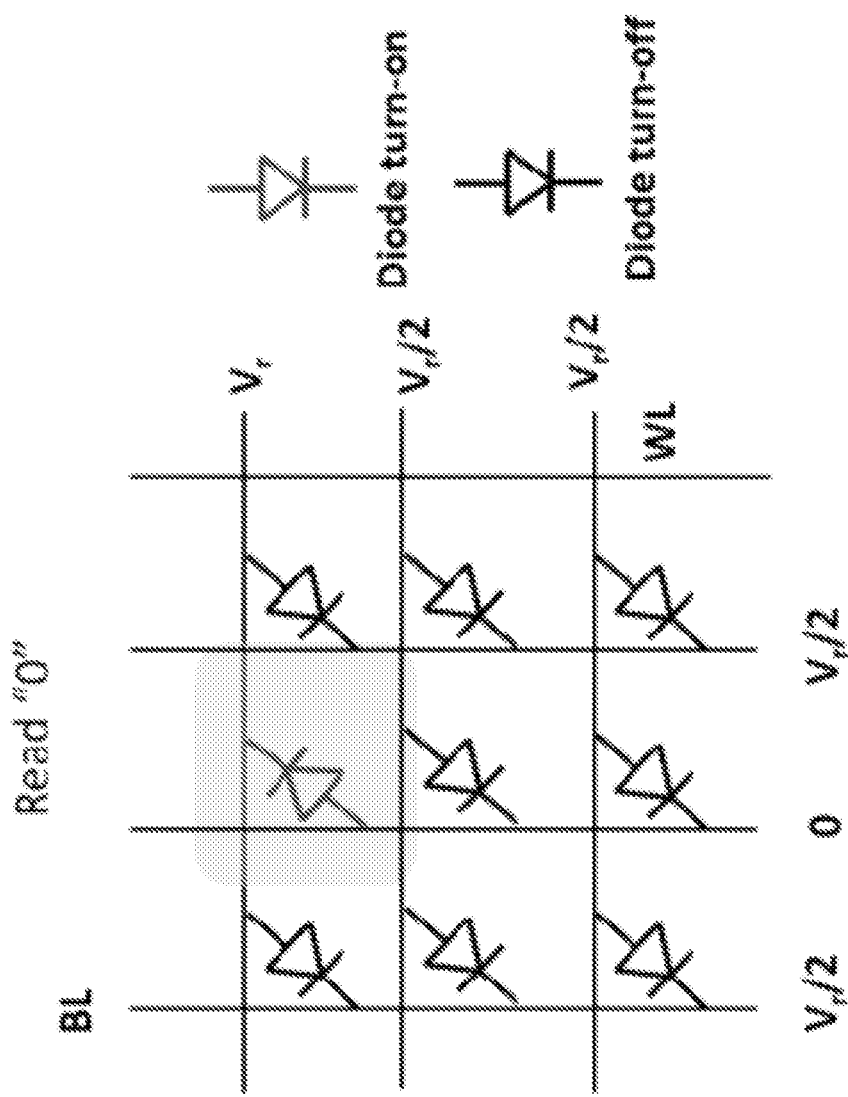
FIG. 4 illustrates implementation of storages modes. By high on/off and self-rectifying ration, the V/2 scheme can be applied on readout and programming of 0-T RAM.

FIG. 14a shows the gradual switching in a FeD by stepwise voltage pulse modulation. The FeD cells are gradually programmed into 16 distinct conductance states using stepwise voltage pulses. These conductance states show a high degree of linearity with number of programming pulses as discussed below. The figure (left) shows a sequence of programming operations in which the stepwise voltage pulses (ranging from 16 V to 19 V) are applied on the top electrodes on the FeDs followed each time by an erase operation. The callout window (right) shows the conductance versus pulse number for a representative cycle. FIG. 4b shows that the FeD device is capable of voltage pulse-induced analog bipolar switching (ranging from 16 V to 19 V, left). The callout window (right) shows one cycle of gradual programming and gradual erasing. The FeD device showed superior linearity ($R^2$ score of 0.9997 for a linear fit) for 16 distinct conductance states over bidirectional modulation. Conductance retentions for 16 distinct conductance states are shown in FIG. 14c, and show no obvious degradation. FIG. 4d shows conductance states distribution of five separate FeD devices subjected to the identical sequences of 16 program pulses (2 µs pulse width) with interleaved reads (8 V). The results show negligible device-to-device variations between those FeD devices. We note that the range of conductance in FeD devices used to program these states (~25-250 nS) is much smaller as compared to the range of conductance used for TCAM operations (~2-250 nS). This is primarily because this linearity in operation is better achieved in a smaller range of conductance. Further the DNN inference application does not necessarily require a high range of conductance modulation. We simulate the performance of arrays comprising such FeD devices in a practical application where a trained convolutional neural network (CNN) is used for computer vision. A CNN (including two convolutional layer and one fully connected layer) was trained on the MNIST dataset (MNIST, Modified National Institute of Standards and Technology database), which is followed by transferring the pretrained weights to the FeD conductance range. An illustration of the network is shown in FIG. 14e. We analyse the accuracy degradation due to weight transfer to low-precision conductance values with an added varying factor A, which is an indicator of non-linearity. The relationship between the A factor and the non-linearity has been discussed in Supplementary Note 3 in detail. The weights of the full-precision trained network are therefore quantized to a number of conductance states (varying from 1 to 9-bit). Then, the network's accuracy on the MNIST testing dataset is re-evaluated. Convolutional neural networks are generally robust to low-precision weight transfer with low non-linearity (A>0.5), as can be seen in FIG. 14f, where for low-weight transfer variation, the full-precision testing accuracy of 97.5% on single-precision floating-point format (FP32) is recovered with just 3 bits of weight precision. For high non-linearity (A<0.35), there requires one or two bits weight precision to recover full-precision testing accuracy on FP32, which shows that sparsely but linearly arranged conductance states with superior linearity can replace a large amount of conductance states to perform equivalent inference accuracy. Furthermore, we simulate the in-memory implementations of in-situ training on FeD arrays where the same convolutional neural network is being trained and weight updates are directly mapped to the realistic conductance states of the FeDs after each backpropagation. As shown in FIG. 14g, for the demonstrated 16 separate conductance states in FIG. 14a in the FeD devices, the in-situ learning accuracy suffers a ~2% degradation compared to the accuracy trained on FP32.

However, with more advanced low-precision training techniques and model compression techniques on software, we believe this number can be substantially reduced, allowing for little to no accuracy degradation when performing low-precision weight transfer to FeD devices in the training phase.

Hence AlScN based ferrodiode devices are BEOL compatible platform for multi-functional CIM in a transistor free architecture. Our experimental demonstration of search function is realized via a TCAM circuit with lateral cell footprint and search delays bettering all existing and experimental NVM technologies. Finally, we demonstrate a stable, pulse-programmable 4-bit memory from ferrodiode devices combined with hardware implementation of a convolutional neural network with inference accuracy comparable to software. Our work therefore opens new possibilities in CIM platforms by enabling architectures with novel ferroelectric materials and diode devices made using them.

FIG. 14. FeD-based neural network. a, Gradual switching in a ferrodiode (FeD) by stepwise voltage modulation pulses. The FeD cells are gradually programmed into various conductance states using stepwise voltage pulses. The left panel shows a sequence of programming operations in which the stepwise voltage pulses are biased on the top electrodes on the FeDs followed each time by an erase operation. Callout window (right panel) shows conductance versus pulse number for a representative cycle. b, The FeD is demonstrated to be capable of voltage pulse-induced analog bipolar switching (left). Callout window (right) shows one cycle of gradual programming and gradual erasing. The FeD device showed superior linearity over 16 distinct states. c, Resistance retentions for 16 distinct resistance states. d, Resistance states distribution of five separate FeDs subjected to sequences of 16 program pulses (2 µs pulse width) with interleaved reads (8 V). e, Illustration of a CNN trained for the MNIST dataset. A hardware implementation of a neural network using ferro-diode arrays for the matrix multiplications can operate in a fully analog mode without the peripheral analog-to-digital converters. f, Simulated performance of inference efficacy of the network in e. The simulation comprises of FeD devices implementing analog weight layers, with inaccurate weight mapping of the network trained on MNIST with FP32 compute. The simulations in (f) demonstrate that degradation of the network's inference accuracy is less than 1% for low weight precision of just 3 bits for A<0.5. g, Simulations of in-situ training of the network in (e) directly with the FeD devices implementing analog weight layers. Leveraged by the superior linearity in the gradual programming of the FeDs, the analog weight layers with 16 resistance states have been simulated to perform at an inference accuracy comparable to the FP32 compute baseline.

Device Fabrication

FeD consisted of a film stack of Al (80 nm)/$Al_{0.68}Sc_{0.32}N$ (45 nm)/Al (30 nm) on top of Si/$Al_{0.8}Sc_{0.2}N$ (85 nm) substrate. To prepare this stack, we start by sputter depositing a layer of 85-nm thick $Al_{0.80}Sc_{0.20}N$ template on the top of a 6" Si <100> wafer. The $Al_{0.8}Sc_{0.2}N$ was deposited using pulsed-DC reactive sputter deposition of a single-alloyed $Al_{0.8}Sc_{0.2}$ target using 5 KW of target power, a pressure of $7.47 \times 10^{-3}$ mbar, and a deposition temperature of 375° C. in a $N_2$ atmosphere. The first layer of 85 nm $Al_{0.8}Sc_{0.2}N$ serves to orient the subsequent 80-nm thick Al layer into a {111}-orientation. This Al (80 nm thick) layer serves as the bottom electrode for the second layer of $Al_{0.68}Sc_{0.32}N$ (45 nm thick), which is the ferroelectric layer used in this device. The 45-nm thick ferroelectric $Al_{0.68}Sc_{0.32}N$ film was co-sputtered from separate 4-inch Al and Sc targets in an Evatec CLUSTERLINE® 200 II pulsed DC Physical Vapor Deposition System. The Al and Sc targets were operated at 1250 W and 695 W, respectively, at a chuck temperature of 350° C. with 10 sccm of Ar gas flow and 25 sccm of $N_2$ gas flow. The chamber pressure was maintained $\sim 1.45 \times 10^{-3}$ mbar. This sputter condition resulted in a deposition rate of 0.3 nm/sec. The highly oriented {111} Al layer promotes the growth of AlScN with its [0001] axis direction being perpendicular to the substrate, thus, yielding a highly textured FE film. Then, without breaking vacuum, a layer 30 nm Al layer was sputtered as the top electrode and as a capping layer to prevent the oxidation of ferroelectric $Al_{0.68}Sc_{0.32}N$.

Device Characterization

Current-voltage measurements were performed in air at ambient temperature using a Keithley 4200A semiconductor characterization system. P-E hysteresis loops and PUND measurements of ferroelectric AlScN were conducted using Keithley 4200A semiconductor characterization system and a Radiant Precision Premier II testing platform. TEM cross-sectional sample was prepared in a FEI Helios Nanolab 600 focused ion beam (FIB) system using the in-situ lift-out technique. The sample was coated with thin carbonaceous protection layer by writing a line on the surface with a Sharpie® marker. Subsequent electron beam and ion beam deposition of Pt protection layers were used to prevent charging and heating effects during FIB milling. At the final cleaning stage, a low-energy Ga+ ion beam (5 keV) was used to reduce FIB-induced damage. TEM characterization and image acquisition were carried out on a JEOL F200 operated at 200 kV accelerating voltage. The sample was orientated to the [001] zone axis for imaging. All of the captured TEM images were collected using Digital Micrograph software.

Compact Model for Evaluation of ON/OFF Ratios of Ferroelectric Diode

General Method of ON/OFF Ratio Evaluation

To evaluate the ON/OFF ratio and capture the IV characteristics of the ferroelectric diodes (FeDs), generally, we need to resolve the electron transport in the ferroelectric diode. Within the ferroelectric, there are three main methods of electron transport: direct tunneling, Fowler-Nordheim tunneling, and thermionic emission, the band diagrams illustrating each effect are shown in FIG. 15. We can use the Wentzel-Kramers-Brillouin (WKB) approximation to encompass all three methods with one formula. In the approximation, the tunneling probability is given by:

$$T(E) = \exp\left(-\frac{2}{\hbar}\int_{x_1}^{x_2}\sqrt{2m^*[(E_c + qV(x)) - E]}\,dx\right) \quad \text{(formula 1)}$$

where m* is the effective mass of the electron, $E_c$ is the coercive field of the ferroelectric, V(x) is the voltage across the ferroelectric, and E is the applied field. We can give the integrand for the density of states as $$N(E) = k_B T \ln\left(\frac{1 + \exp\left(\frac{E - E_{f,1}}{k_B T}\right)}{1 + \exp\left(\frac{E - E_{f,2}}{k_B T}\right)}\right) \quad \text{(formula 2)}$$

where $K_B T$ is the Boltzmann constant multiplied by temperature, $E_{f,1}$ and $E_{f,2}$ are the Fermi-levels at the left and right of the ferroelectric. With these formulas, we can define the current density J as $$J = \frac{4\pi m^* q}{\hbar^3}\int_{E_{min}}^{E_{max}} T(E)N(E)dE \quad \text{(formula 3)}$$

This current density multiplied by the area of the ferroelectric film gives the tunneling current through the device. While this model does effectively capture the I-V characteristics of a ferroelectric diode, it lacks efficiency.

FIG. 15 illustrates of the three methods of electron transport through a potential barrier. (a) direct tunneling (b) Fowler-Nordheim tunneling (c) thermionic emission.

Voltage Shifting Model and its Verification.

Voltage Shifting Model.

In the analysis, we proposed a new compact shift model to describe the I-V characteristics of the FeDs. In the FeD, we can treat the changes in the I-V curve of the diode from the low resistance state (LRS) to the high resistance state (HRS) as the I-V curve shifting from left to right by the amount of $\Delta V$ as the diode transforms from LRS to HRS. In other words, it takes more voltage to offset the voltage of $\Delta V$ at HRS to generate the same current as the current at LRS. The shifted voltage $\Delta V$ can be derived as:

$$\Delta V = E_{dp}t \quad \text{(formula 4)}$$

where t is the thickness of the ferroelectric layer, and $E_{dp}$ is the depolarization field of the ferroelectric, and we found that we can express the depolarization field as:

$$E_{dp} = E_C \tanh\left(\frac{\beta P_r}{\epsilon_{fe}E_C}\right) \quad \text{(formula 5)}$$

where $E_C$ is the coercive field of the ferroelectric layer, $P_r$ is the remanent polarization, $\epsilon_{fe}$ is the dielectric constant of the ferroelectric, and $\beta$ is the parameter related to the oxide capacitance $C_{ox}$ and the ferroelectric capacitance $C_{fe}$, as:

$$\beta = \left[\left(\frac{C_{ox}}{C_{fe}} + 1\right)\right]^{-1} \quad \text{(formula 6)}$$

Comparison Between the Voltage Shifting Model and WKB Approximation.

We verified that the voltage shifting model showed a relatively consistent result as the I-V characteristics of the ferroelectric diode modeled by the WKB approximation, shown in FIG. 16. In addition, the voltage shifting model is much more efficient since it utilizes analytical equations as opposed to numerical integration as the WKB approximation did. Furthermore, the new model's hyperbolic function helps us focus on the readout voltage region of the I-V curve since the depolarization field $E_{dp}$ would not exceed the coercive field $E_c$ in the model.

FIG. 16. Comparisons of the IV curves using the WKB approximation (green) vs. the new voltage shifting model for a ferroelectric diode (blue) for any arbitrary ferroelectric. The purple curve represents the base curve at high-resistance state modeled with the WKB approximation.

I-V Curves and ON/OFF Ratio Related to the Voltage Shifting Model.

After the verification of this compact model, we used this model to find the overall trend of the relationships between the ON/OFF ratios of the ferroelectric diodes and parameters such as oxide capacitance, remanent polarization, and coercive field.

I-V Curves and ON/OFF Ratio Changing with Oxide Capacitance.

First, we plot the I-V curve of the FeD shifting under different insulator capacitance. We pre-coded the oxide capacitance into $\beta$ using eq. 6, and $\beta$ should vary between 0 and 1. By choosing the proper value of remanent polarization and coercive field, the simulated I-V curve of HRS shifting is shown in FIG. 17(a). Correspondingly, the ON/OFF ratio under different $\beta$ is demonstrated in FIG. 17(b).

FIG. 17 includes the plot of HRS I-V curve shifting with the variation of the pre-coded oxide capacitance $\beta$ is shown in (a), we vary $\beta$ from 0.01 to 0.54 exponentially to get a better view of the I-V curve shifting trend. (b) is the ON/OFF ratio vs. $\beta$, and the ON/OFF ratio is the current ratio between LRS and corresponding shifted curve at the voltage of 7 V in (a).

I-V Curves and ON/OFF Ratio Changing with Remanent Polarization.

Second, we vary the remanent polarization $P_r$ from 1 to 135 $\mu$C/cm$^2$ with a suitable insulator capacitance $C_{ox}$ and coercive field $E_C$, and the resulting I-V characteristics are shown in FIG. 18(a). The corresponding ON/OFF ratio under different remanent polarization is demonstrated in FIG. 18(b).

FIG. 18 includes the plot of HRS I-V curve shifting with the variation of the remanent polarization $P_r$ is shown in (a), we vary $P_r$ from 1 to 135 $\mu$C/cm$^2$ exponentially to get a better view of the I-V curve shifting trend. (b) is the ON/OFF ratio vs. $P_r$, and the ON/OFF ratio is the current.

I-V Curves and ON/OFF Ratio Changing with Coercive Field.

Last, the I-V curve shifting plot for coercive fields $E_c$ linearly ranging from 0.12 to 3.12 MV/cm is shown in FIG. 19(a). The corresponding plot of the ON/OFF ratio of the FeD under different coercive fields is shown in FIG. 19(b).

FIG. 19. The plot of HRS I-V curve shifting with the variation of the result of the coercive field $E_C$ is shown in (a), we vary $E_C$ from 0.12 to 3.12 MV/cm linearly to get a I-V curve shifting trend. (b) is the ON/OFF ratio vs. $E_C$, and the ON/OFF ratio is the current ratio between LRS and corresponding shifted curve at the voltage of 7V in (a).

The I-V curves in FIGS. 17-19 show that the HRS curve shifts further when encoded insulator capacitance $\beta$, remanent polarization $P_r$, or coercive field $E_c$ increases. And from both eq. 5 and FIG. 17-19, we can find out the hyperbolic function in eq. 5 limits the influence on the I-V curve shifting by the remanent polarization $P_r$ and the oxide capacitance $\beta$. On the other hand, we can find that the ON/OFF ratio increases drastically with the coercive field $E_c$ increasing, and the hyperbolic function does not limit it.

Linearization on the Current-Voltage Relationship of Ferroelectric Diode

With the log I-V characteristics of the device shown in FIG. 20, the log I has excellent linearity with the voltage applied, and the slopes of the plots in 16 different states of the device are consistent in the fitting.

FIG. 20. Log(I) vs V. Current I measured by applying dc voltage sweeping to 16 different states.

To linearize the I-V characteristics of a ferroelectric diode, we can have:

$$I = G_i \exp(\alpha V) \qquad \text{(formula 7)}$$

where the $G_i$ is a parameter that is related to the i'th conductance of the diode.

The constant slope $\alpha$ can be estimated through a linear regression method over the 16 distinct log I-V characteristics of the ferroelectric diode device.

FIG. 21. Current I vs. $\exp(\alpha V)$ for 16 different states. From FIG. 21, we can see that a ferroelectric diode's I–$\exp(\alpha V)$ characteristics in 16 different states show superior linearity and intersection at the origin, which is the same as the I-V characteristics of an Ohmic resistor. The different slopes of all 16 states are proportional to the conductance of the 16 states, which also behave in a linear manner.

With the linear characteristics between current I and the function of voltage $f(V) = \exp(\alpha V)$, we can linearly map the input to $f(V)$. For example, we have an input ranges from 0 to 1, we can map the input 1 to the $\max(\exp(\alpha V))$, input 0 to the $\min(\exp(\alpha V))$, and input between 0 and 1 to be distributed evenly between $\min(\exp(\alpha V))$ and $\max(\exp(\alpha V))$. Therefore, we can map each input to its corresponding $f(V)$, and decode $f(V)$ to find its corresponding Voltage V by:

$$V = \frac{1}{\alpha} \ln f(V) \qquad \text{(formula 8)}$$

FIG. 22. (a) A picture of a number '5' as input from MNIST dataset. (b) Plotting after mapping and encoding the input signal into the realistic voltage V, the feature remains after converting the input signal to the voltage applied on the device.

FIG. 22(b) shows a transformation from the given input from the MNIST shown in FIG. 22(a), with the intensity as the input signal, to the encoded voltage amplitudes applied on the device. By this method, we could use the AlScN ferroelectric diode as a simple resistor in neural network computation by simply encoding the input V to the function $f(V)$, then we could have the current I measured as the output, shown below:

$$I = G_1 f(V_1) + G_2 f(V_2) + G_3 f(V_3) + \ldots \qquad \text{(formula 9)}$$

To verify the encoding scheme on the realistic device, we encode a series of inputs in the range of [0, 1] to our read voltage range [4V, 8V]. Then, we directly apply the encoded voltages on the ferroelectric diode devices and measure the current as the output which is responding to the original input.

FIG. 23. The measured current at the output with applying the encoded voltages on the ferroelectric diode devices which are responding to the original input.

As shown in FIG. 23, the output current presents a superior linearity on the input showing a $R^2$ score of 0.9998 for a linear fit, which verifies that we could use the AlScN ferroelectric diode as a simple resistor in neural network computation by simply using this linearization encoding method.

Nonlinear Weight Update of Ferroelectric Diode

As we are typically using a linear quantization scheme when mapping the pre-trained weights to memristors, ideally, the amount of weight increase and weight decrease should be linearly proportional to the number of write pulses. However, the realistic devices reported in the literature do not follow such ideal trajectory where the conductance typically changes rapidly at the beginning then gradually saturates. This is one of the main reasons inhibiting highly accurate hardware matrix multiplication. Those non-linear weight updates of real devices can be evaluated by a factor A:

$$G(N) = G_{min} + (G_{max} - G_{min})\frac{1 - e^{-N/A}}{1 - e^{-N_b/A}} \qquad \text{(formula 10)}$$

where $G_{min}$ and $G_{max}$ are the minimum and maximum conductance measured in the device, N is the pulse number we applied and $N_0$ is the maximum number we will apply. We could conclude from the above equations that as A decreases, the devices perform worse non-linear weight updates.

FIG. 24. (a) The normalized conductances by non-linear weight updates with different factor A. (b) The normalized conductances measured in the realistic FeD devices, which shows a near-ideal weight updates.

As shown in FIG. 24(b), the normalized conductances measured in our demonstrated FeD devices show near-ideal weight updates showing an A over 10 and $R^2$ score of 0.9997 to the ideal values.

Table 1 of the Appendix shows voltage modes and encoding table for various values of stored states, search voltages, and search results for the demonstrated TCAM.

FIG. 25. a, Schematics of the signal sequences for the PUND measurements to differentiate the ferroelectric and non-ferroelectric contributions to the polarization. b, PUND current densities showing ferroelectric switching within 400 ns of the onset of the voltage switching pulse.

FIG. 26. Dynamic current response in 45 nm AlScN. a, Schematics of the signal sequences for the dynamic current response measurements to observe the ferroelectric switching induced current response. b, The current-voltage hysteresis loops of a 45 nm thick AlScN corresponding to the signal sequences shown in a. The above plot shows a positive coercive field of +4.62 MV/cm and a negative coercive field of −3.79 MV/cm. Leakage optimization of the ferroelectric films is subject of ongoing work.

FIG. 27. The TCAM cell structure makes it natural to utilize the FeD crossbar memory array, in which the signal lines connecting to the anode and to the cathode are parallel in a bit search for the TCAM demonstration

Example: CMOS Compatible Aluminum Scandium Nitride-based Ferroelectric Diode Memory Device An example back-end-of-line (BEOL), complementary-metal-oxide-semiconductor (CMOS) compatible $Al_{0.64}Sc_{0.36}N$-based ferroelectric diode shows polarization dependent hysteresis in its leakage currents. Our device comprises a metal/insulator/ferroelectric/metal structure (Pt/native oxide/$Al_{0.64}Sc_{0.36}N$/Pt) that is compatible with BEOL temperatures (≤350° C.) grown on top of a 4-inch silicon wafer. The device shows self-selective behavior as a diode with >$10^5$ rectification ratio (for 5 V). It can suppress sneak currents without the need for additional access transistors or selectors. Furthermore, given the polarization dependent leakage, the diode current-voltage sweeps are analogous to that of a memristor with an On/Off ratio of ~50,000 between low and high resistance states. Our devices also exhibit stable programmed resistance states during DC cycling and a retention time longer than 1,000 s at 300K. These results demonstrate that this system has significant potential as a future high-performance post-CMOS compatible non-volatile memory technology New device applications such as the Internet of Things (IoT) devices, non-von Neumann computing architectures, and artificial intelligence (AI) computing algorithms are creating a strong demand for high-density, non-volatile memory (NVM) solutions with low power consumption. Among various emerging NVM technologies, ferroelectric random-access memories (FeRAM) are compelling due to their high access speed, high endurance, extremely low write energy and current, and good retention. However, the incorporation of FeRAM into commercial scale semiconductor applications has been stalled at the 130-nm node. There are three main challenges that have hindered rapid development of ferroelectric (FE) memories and has kept them from challenging classical charge-based memories and other NVM technologies: (1) the traditional one transistor-one ferroelectric capacitor (1T1C) structure undergoes destructive readout and has a large footprint; (2) traditional ferroelectrics are incompatible with standard BEOL, CMOS process; (3) as perovskite FE materials such as lead zirconium titanate (PZT) or barium titanate (BTO) are scaled to thinner layers their ferroelectric properties degrade.

Various emerging technologies have been developed over the past decade to address these issues. Two terminal devices such as the ferroelectric diode and ferroelectric tunnel junction (FTJ), which utilize a polarization-dependent leakage or tunneling current and rectification to perform resistive switching (analogous to memristors), are a promising alternate to a 1T1C cell. This is because it has the advantage of being a compact, two-terminal geometry device that uses a non-destructive read-out. Recently, FTJ memristors based on doped $HfO_2$ have attracted considerable attention for compact non-volatile memory applications. However, the high annealing temperatures (≥400° C.) necessary for doped $HfO_2$ to attain ferroelectricity in most reports renders them unsuitable for CMOS BEOL process integration. A high On/Off ratio is essential not only to enable low power, in-memory computing but also for maintaining a strong immunity to noise and variations when used in emerging applications such as multi-bit memory devices for neuromorphic computing.

The recent discovery of Sc-doped AlN as a ferroelectric presents a promising avenue for the realization of practical two-terminal ferroelectric non-volatile memory devices. AlN alloyed with Sc shows large coercive fields, $E_c$, of 2-4.5 MV/cm, which enables scaling to thinner ferroelectric layers, while maintaining a large memory window. When combined with high remnant polarizations—$P_r$, of 80-115 $\mu C/cm^2$—this leads to significant resistive switching, due to the strong tunnel barrier modulation, and thus a high On/Off ratio. The more recently reported ferroelectric switching in sub-20 nm Sc-doped AlN at low deposition temperature (≤350° C.), allows for these devices to be integrated directly in a CMOS, BEOL-compatible process.

Here, we demonstrate $Al_{0.64}Sc_{0.36}N$-based ferroelectric diodes that are fabricated in a fully BEOL, CMOS-compatible process on a 4-inch Si wafer. With 20-nm-thick $Al_{0.64}Sc_{0.36}N$ as a ferroelectric layer with a thin native oxide barrier layer, the resulting ferroelectric capacitors show a polarization dependent hysteresis in leakage current, with a large self-rectifying ratio >$10^5$, a high On/Off ratio of over 50,000, a stable programmed state over DC cycling, and a retention time longer than 1,000 s at 300K. These results hold promise for future high-performance, CMOS BEOL compatible NVM.

FIG. 28(a) shows the schematic diagram of a Pt/native oxide/$Al_{0.64}Sc_{0.36}N$/Pt device. A Pt (100 nm) bottom electrode (BE) was deposited by sputtering onto the Si substrate.

Next, a 20-nm $Al_{0.64}Sc_{0.36}N$ film was co-sputtered from two separate 4-inch Al (1000 W) and Sc (655 W) targets in an Evatec CLUSTERLINE® 200 II pulsed DC Physical Vapor Deposition System. The deposition was done at 350° C. with $N_2$ gas flow of 20 sccm. Subsequently, top electrode (TE) regions were then patterned using standard photolithography, as shown in FIG. 28(c), followed by evaporation of a Pt (100 nm) metal top electrode and lift-off process. FIG. 28(b) shows a cross-sectional transmission electron microscopy (TEM) image of the $Al_{0.64}Sc_{0.36}N$ film on Pt BE. In FIG. 28(b) inset, the high-resolution TEM image of the regions enclosed by the red boxes illustrates textured epitaxial growth of the $Al_{0.64}Sc_{0.36}N$ film and a ~4 nm native oxide layer at the ferroelectric surface due to exposure to ambient air. The energy dispersive X-Ray spectroscopy (EDS) analysis map of the device cross section suggests that the oxide has similar Al and Sc concentration as the nitride. We note that the presence of oxide is not necessary to demonstrate the most basic and distinguishing property of our device which is the polarization dependent leakage as discussed in more detail below. The Schottky barrier between $Al_{0.64}Sc_{0.36}N$ and Pt introduces the asymmetry in the device structure. The modulation of this Schottky barrier with ferroelectric polarization switching provides the large difference in leakage current between sweeps combined with the rectification function in the device (similar to a diode) and hence the term ferroelectric diode. There are several other examples in the literature based on other ferroelectric materials that have shown the same device concept, function and have been referred to by the same name. Here we demonstrate this concept in an AlScN based ferroelectric material.

Since the leakage in our device is both polarization-dependent and asymmetric in nature, the ferroelectric polarization upon switching is convoluted by leakage in a typical polarization-electric field (P-E) loop measurement. To overcome this issue, positive up, negative down (PUND) measurements were performed at low temperature (120 K) and at a relatively high frequency (10 kHz) to suppress leakage and clarify the FE properties of the $Al_{0.64}Sc_{0.36}N$. More details of P-E hysteresis measurements at room temperature can be found in our previous works. FIG. 28(c) presents a typical P-E hysteresis loop of the $Al_{0.64}Sc_{0.36}N$ device as extracted from the PUND measurements. The pulse schematic of the PUND measurement is provided in supplementary information FIG. 32 as well as our prior works. The measurement indicates a coercive field of 6.5 MV/cm and a remnant polarization of 25 $\mu C/cm^2$. The coercive field is observed to be slightly larger than the values observed in our DC measurements. We posit that this is because the coercive field is reported to significantly increase as temperature drops and as the frequency of measurement increases. We attribute the relatively lower remnant polarization to the partial ferroelectric switching during the PUND measurement at low temperature. Further, the C-V curve of our device measured at 1 MHz at room temperature (FIG. 28(d)) illustrates a butterfly-shaped loop suggesting a non-linear capacitor that has decreasing capacitance with increasing applied voltage, indicating ferroelectric polarization switching. Similar C-V curves have been reported for FTJ or ferroelectric diode devices based on other FE materials. In addition, we observe a clear ferroelectric switching induced peak during our first C-V sweep which disappears upon repeated C-V measurement sweeps (See supplementary information FIG. 33) further suggesting the ferroelectric nature of the switching.

FIG. 29 shows the I-V characteristics of the $Al_{0.64}Sc_{0.36}N$ ferroelectric diodes in semi-log and linear scale. The blue plots represent non-linear diode-like I-V curves in which polarization points to TE after applying a negative program voltage, whereas the orange plots show I-V curves in which polarization points to BE after applying a positive program voltage. After being programmed by a positive voltage, the resistance changes from high-to-low, and the polarity of the memristor changes from a negative-forward diode (blue lines) to a positive-forward diode (orange lines). Similarly, it can be observed in a negative voltage sweep that the polarity of the memristor changes from that of a positive forward diode to that of a negative-forward diode. Because of the existence of a Schottky barrier between the $Al_{0.64}Sc_{0.36}N$ and the metal electrode (Pt), the device shows self-selective behavior as a diode with $>10^5$ rectification ratio for 5 V, which is likely to suppresses sneak currents without additional access transistors or selectors when used in crossbar-arrays. A large On/Off current ratio of 50,000 is obtained between forward and backward voltage sweeps at a readout bias voltage ~2.5V, which exceeds the On/Off ratios of previously reported in hafnia-based FTJs and ferroelectric diodes. A summary of important characteristics of ferroelectric memristive devices from the literature is presented in Table 2 o the Appendix, with a focus on the CMOS compatibility, On/Off ratio, and the thickness of the ferroelectric layers. It is worth noting that our reported $Al_{0.64}Sc_{0.36}N$-based ferroelectric diodes is one of two demonstrated examples that concurrently exhibits a high ON/OFF ratio while being compatible with CMOS BEOL processing. We note that while the presence of surface oxide may be critical to obtain large On/Off current ratios, an oxide layer is not necessary or important to demonstrate a ferrodiode effect in our devices. This is further evident from our Al (30 nm)/$Al_{0.68}Sc_{0.32}N$ (45 nm)/Al (85 nm) in-situ deposited MIM ferrodiodes that show a similar effect with an On/Off ratio of ~100 (See supplementary information S3).

Furthermore, we studied the effect of polarization on the band diagram and electronic transport in these $Al_{0.64}Sc_{0.36}N$ FTJs. We note that given that our $Al_{0.64}Sc_{0.36}N$ films are sputter deposited and contain a large number of point and line defects, they are bound to possess several trap states within the band-gap. Therefore, current conduction through a MIM ferroelectric diode device with 20 nm thick ferroelectric insulator must account for some trap assisted transport/conduction mechanism as a means to explain the μA level currents observed in our measurements under forward bias. We therefore fitted the forward current through the diode versus applied voltage with a well-known trap assisted conduction and leakage current model, namely the Poole-Frenkel (P-F) tunneling model. In addition, we have also sought to compare Fowler-Nordheim or direct, wave-mechanical tunneling of electrons through a modulated triangular barrier. The ferroelectric polarization charge effects induce an asymmetric modulation of the electronic band diagram. As shown in FIG. 30, when P is reversed, the steepness of the electronic band diagram is changed, depending on whether the direction of P is identical or opposite to the applied electrical field. As show in FIG. 30, when a positive voltage is applied to the TE, the barrier height is—on average—higher when P points to the TE than when P points to the BE. Electronic band-diagrams of high resistance states (HRS) and low resistance states (LRS) of the ferroelectric diode at positive bias, with two conduction mechanisms, have been sketched in FIGS. 30(a) and (b). Given the ~20 nm thickness of the ferroelectric insulator layer direct wave-mechanical tunneling is expected to be negligible since tunneling probability exponentially decays with the width of the barrier. Therefore, our current-voltage data fits best to the P-F tunneling model, as shown FIG. 30(c). The extracted dielectric constant of ~16 of the ferroelectric layer from the P-F model is also close to independent capacitance measurements of 14~15. We note that the ferroelectric polarization switching occurs in our device due to the applied electric field and this switch in polarization changes the field profile and leakage through the 20 nm thick ferroelectric layer. The trap-assisted Poole-Frenkel tunneling is used to describe this leakage mechanism. It is also worth noting that similar mechanisms have also been used to describe conduction through FTJ devices where the ferroelectric layer thickness is much smaller. For the LRS, the applied electrical field follows the ferroelectric polarization direction. The injected electrons hop from highly occupied traps to empty traps and consequently, the current is high. Conversely, if the applied electrical field is opposite to the ferroelectric polarization direction, the electron hopping rate is significantly reduced, since there are fewer occupied electrons. This leads to empty traps, breaking the total number of conduction pathways and results in a lower current through the diode. While a full compact I-V model for the device will be important and is a subject of ongoing research, it is beyond the scope of the current manuscript and will be reported in our future works. Finally, we would also like to note that conductive bridge formation can be ruled out as the resistive switching in our devices based on area dependent current density scaling in our MIM devices. We have verified this with linear scaling of the ON current with the area of our MIM devices further verifying the ferroelectric nature of the resistive switching (see supplementary information S4).

We have also conducted preliminary reliability tests on our ferroelectric diodes. FIG. 31(a) presents data from 10 manually performed DC cycles. Cyclic I-V curves from the same device indicate that the current-voltage characteristics are stable and repeatable. Furthermore, the two different polarization states of the ferroelectric and hence resistance (current) states of the memristor can be programmed as two non-volatile memory states. Readouts at various delay times were carried out to determine retention (FIG. 31(b)). The low and high current/resistance states can be retained for at least 1,000 secs at room temperature without obvious degradation. Given the purely electronic mechanism of switching in our ferroelectric diode, like all other ferroelectric memory devices, it is subject to the voltage-time dilemma. However, this voltage-time dilemma can be minimized with thinner ferroelectric layers and having near-ideal (square-shaped) hysteresis loops concurrently with high coercive fields, a property that AlScN materials possess.

This $Al_{0.64}Sc_{0.36}N$-based ferroelectric diode shows a large difference in leakage current as a function of ferroelectric polarization resulting in hysteretic current voltage loops analogous to a memristor. Our devices are fabricated in a fully BEOL, CMOS-compatible process on 4-inch Si wafers. With 20-nm-thick $Al_{0.64}Sc_{0.36}N$ as a ferroelectric layer, the resulting ferroelectric diodes exhibit high performance with a large self-rectifying ratio $>10^5$, a high on/off ratio of over 50,000, a stable programmed state over DC cycling, and a retention time longer than 1,000 s at 300K. These results demonstrate that this system has significant potential as a future high-performance CMOS BEOL compatible non-volatile memory technology.

FIG. 28. (a) Schematic of the metal/oxide/$Al_{0.64}Sc_{0.36}N$/ metal memristor device. (b) Cross-section transmission electron micrograph of the device showing a Pt bottom electrode grown on the Si wafer substrate, as well as the $Al_{0.64}Sc_{0.36}N$ ferroelectric. Inset, the high-resolution TEM images of the regions enclosed by the red boxes combined with elemental mapping using EDS. (c) $Al_{0.64}Sc_{0.36}N$ PUND measurement results measured at 120 K. (d) Representative C-V curve of our devices measured at 1 MHz at room temperature, illustrates a typical butterfly loop.

FIG. 29. (a) Semi-log and (b) Linear current-voltage characteristics of the ferroelectric memristor. The blue plots represent nonlinear I-V curve after applying a negative program voltage, whereas the orange plots show I-V sweeps in which the resistance state has been programmed by a positive voltage.

FIG. 30. (a) Electronic band diagrams-of HRS and (b) LRS in our MIM devices. Note that the slopes of lines are a measure of the E-field and that the trap levels are assumed to be at mid-gap. (c) Fitting of experimental current-voltage data to the Poole-Frenkel tunneling model showing a good fit with extracted dielectric constant of ~16 of the insulator which matches with independent capacitance measurements.

FIG. 31. (a) Cyclic IV curves over manual DC switching cycles showing stability and repeatability of FTJs. (b) Retention of the low and high current/resistance states ~1,000 s, by the readout at 5 V.

FIG. 32. A schematic of the pulse sequence for PUND measurement. The ferroelectric response of the AlScN thin film was characterized by a PUND measurement using 5 monopolar triangular signals with a 1 ms delay between two pulses.

FIG. 33. (a) Schematic cross sections of Ferroelectric (FE) AlScN metal-insulator-metal devices with polarization directions indicated by arrows for initial and final states of a voltage sweep of a capacitance voltage (C-V) measurement. The voltage sweep numbers are indicated on the arrows. (b) C-V data for the respective sweep numbers indicated in (a). The first sweep shows a clear rise in capacitance up to ~7.5 V followed by a sudden fall which is characteristic of a ferroelectric polarization switching. The remaining sweeps do not show any rise in capacitance indicating that the polarization is retained and not switched when the voltage sign and range of magnitudes applied is the same.

FIG. 34. I-V characteristic of an in-situ deposited MIM Al (30 nm)/$Al_{0.68}Sc_{0.32}N$ (45 nm)/Al (85 nm) ferrodiode device showing qualitatively similar I-V characteristics as the 20 nm thick $Al_{0.68}Sc_{0.32}N$ devices shown in the manuscript. We not that since the above device was deposited in-situ without breaking vacuum, there is no oxide layer in this device and it still shows a ferrodiode switching behavior with an ON/OFF ratio of ~100.

FIG. 35. On state sweeps of current density vs voltage for three circular Pt/native oxide/$Al_{0.64}Sc_{0.36}N$/Pt MIM devices with varying diameter of top electrodes. Current density (current normalized to cross section area) in the On state is overlapping for all three devices suggesting that the conductance or current linearly scales with cross-section area. If the devices involved conductive bridge formation, the current density curves would not be overlapping. We therefore rule out conductive bridge formation as the switching mechanism.

APPENDIX

TABLE 1

| D1 | D2 | Store | SL | $\overline{SL}$ | Search | Results |
|---|---|---|---|---|---|---|
| negative-forward | negative-forward | Don't care | Vr | 0 | 1 | Match |
| negative-forward | negative-forward | Don't care | 0 | Vr | 0 | Match |
| positive-forward | negative-forward | 1 | Vr | 0 | 1 | Match |
| positive-forward | negative-forward | 1 | 0 | Vr | 0 | Mis |
| negative-forward | positive-forward | 0 | Vr | 0 | 1 | Mis |
| negative-forward | positive-forward | 0 | 0 | Vr | 0 | Match |

TABLE 2

| Ferro-electric | CMOS Compatibility | On/Off Ratio | Thickness (nm) |
|---|---|---|---|
| BFO | Low | 20 | 90,000 |
| BFO | Low | 20,000 | 3 |
| PbTiO | Low | 2 | 200 |
| PZT | Low | 300 | 30 |
| BTO | Low | 12,000 | 3.2 |
| BTO | Low | $6 \times 10^6$ | 1.6 |
| HfO$_2$] | Medium | 10-100 | 10 |
| HfO$_2$ | High | 10,000 | 10 |
| This work | High | 50,000 | 20 |

What is claimed:

1. A memory cell, comprising an array of ferroelectric diodes, wherein the ferroelectric diodes comprise doped aluminum nitride (AlN), and wherein the ferroelectric diodes are non-volatile and field programmable via pulsing to a pulse-number-dependent analog state, and wherein the ferroelectric diodes have a self-rectifying ratio greater than 25.

2. The memory cell of claim 1, wherein the ferroelectric diodes comprise aluminum nitride doped with scandium (AlScN), doped with yttrium (AlYN), doped with magnesium and hafnium (AlMgHfN), doped with magnesium and zirconium (AlMgZrN), doped with magnesium and titanium (AlMgTiN), doped with boron (AlBN), or doped with ytterbium (AlYbN).

3. The memory cell of claim 1, wherein the ferroelectric diodes have an on/off ratio greater than 2, 5, 10, 25, 50, 75, 100, 500, 1000, 5000, or 10,000.

4. The memory cell of claim 1, wherein the ferroelectric diodes have a self-rectifying ratio greater than 25, 50, 75, 100, 200, 500, 1,000, 10,000, 50,000, or 100,000.

5. The memory cell of claim 1, wherein the cell is compatible with CMOS back-end-of-line (BEOL) processing.

6. The memory cell of claim 2, wherein the doped aluminum nitride has a deposition temperature of less than 400 degrees C.

7. The memory of cell of claim 1, wherein the ferroelectric diodes are bipolar pulse programmable.

8. The memory cell of claim 6, wherein the ferroelectric diodes are pulse programmable to a 4-bit resolution of states.

9. The memory cell of claim 1, wherein the ferroelectric diodes comprise the doped aluminum nitride layer having a thickness of less than about 100 nm, less than about 75 nm, less than about 50 nm, or less than about 25 nm.

10. An array of memory cells, comprising plural instances of the memory cell according to claim 1, wherein the array of memory cells is arranged for a V/2 scheme that is used to readout and to program the ferroelectric diodes.

11. A Ternary Content Addressable Memory (TCAM), comprising the memory cell according to claim 1.

12. The TCAM of claim 11, wherein the TCAM having a search delay of less than about 1 μs, less than about 500 ns, or even less than about 100 ns, 50 ns, 10 ns, 1 ns, or 100 ps.

13. The TCAM of claim 11, wherein each memory cell comprises two diodes that are oppositely polarized.

14. A Ternary Content Addressable Memory (TCAM), comprising an array of ferroelectric diodes, wherein the ferroelectric diodes comprise hafnium zirconium oxide (HfZrO$_2$), and wherein the ferroelectric diodes are characterized as non-volatile and field programmable via pulsing to a pulse-number-dependent analog state, and wherein the ferroelectric diodes have a self-rectifying ratio greater than 25.

15. The TCAM of claim 14, wherein the TCAM having a search delay of less than about 1 μs, less than about 500 ns, or even less than about 100 ns, 50 ns, 10 ns, 1 ns, or 100 ps.

16. The TCAM of claim 14, wherein each memory cell comprises two diodes that are oppositely polarized.

17. A neural network, comprising an array of multi-bit diode synapses, wherein each multi-bit diode synapse comprises a ferroelectric diode comprising doped aluminum nitride (AlN), and wherein each ferroelectric diode is non-volatile and field programmable via pulsing to a pulse-number-dependent analog state, wherein the ferroelectric diode has search delay of less than about 1 μs.

18. The neural network of claim 17, wherein each ferroelectric diode comprises aluminum nitride (AlN) doped with scandium (AlScN), doped with yttrium (AlYN), doped with magnesium and hafnium (AlMgHfN), doped with magnesium and zirconium (AlMgZrN), doped with magnesium and titanium (AlMgTiN), doped with boron (AlBN), or doped with ytterbium (AlYbN).

19. The neural network of claim 17, wherein the multi-bit diode synapses are arranged in an LeNet-5 architecture in a PyTorch framework.

20. The neural network of claim 17, wherein the neural network exhibits an inference accuracy of at least about 90%, at least about 95%, or at least about 97% on a MNIST dataset.

* * * * *